(12) United States Patent
Fontana et al.

(10) Patent No.: US 12,230,511 B2
(45) Date of Patent: Feb. 18, 2025

(54) METHOD OF MANUFACTURING SEMICONDUCTOR DEVICES AND CORRESPONDING DEVICE

(71) Applicant: STMicroelectronics S.r.l., Agrate Brianza (IT)

(72) Inventors: Fulvio Vittorio Fontana, Monza (IT); Marco Rovitto, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 513 days.

(21) Appl. No.: 17/398,710

(22) Filed: Aug. 10, 2021

(65) Prior Publication Data

US 2022/0059368 A1 Feb. 24, 2022

(30) Foreign Application Priority Data

Aug. 24, 2020 (IT) .................. 102020000020386

(51) Int. Cl.
*H01L 21/48* (2006.01)
*H01L 21/67* (2006.01)
*H01L 23/495* (2006.01)

(52) U.S. Cl.
CPC ...... *H01L 21/4867* (2013.01); *H01L 21/6715* (2013.01); *H01L 23/49513* (2013.01)

(58) Field of Classification Search
CPC ............. H01L 21/4867; H01L 21/6715; H01L 23/49513
See application file for complete search history.

(56) References Cited

U.S. PATENT DOCUMENTS

| 2003/0034568 A1 | 2/2003 | Chai et al. |
| 2005/0145846 A1 | 7/2005 | Brandenburger |
| 2010/0127409 A1 | 5/2010 | Jiang et al. |
| 2011/0095241 A1 | 4/2011 | Kong et al. |
| 2012/0040477 A1 | 2/2012 | Yu et al. |

FOREIGN PATENT DOCUMENTS

| CN | 216288420 U | | 4/2022 |
| JP | 2008153699 A | | 7/2008 |
| KR | 10-2013-0046117 | * | 5/2013 |
| KR | 20130046117 A | | 1/2014 |

OTHER PUBLICATIONS

IT Search Report and Written Opinion for IT Appl. No. 102020000020386 dated Apr. 27, 2021 (8 pages).
CN First Office Action and Search Report for counterpart CN Appl. No. 202110958716.2, report dated Dec. 23, 2024, 7 pgs.

* cited by examiner

*Primary Examiner* — Mathieu D Vargot
(74) *Attorney, Agent, or Firm* — Crowe & Dunlevy LLC

(57) ABSTRACT

At least one semiconductor chip or die is held within at a chip retaining formation provided in a chip holding device. The chip holding device is then positioned with the at least one semiconductor chip or die arranged facing a chip attachment location in a chip mounting substrate. This positioning produces a cavity between the at least one semiconductor chip or die arranged at the chip retaining formation and the chip attachment location in the chip mounting substrate. A chip attachment material is dispensed into the cavity. Once cured, the chip attachment material attaches the at least one semiconductor chip or die onto the substrate at the chip attachment location in the chip mounting substrate.

15 Claims, 19 Drawing Sheets

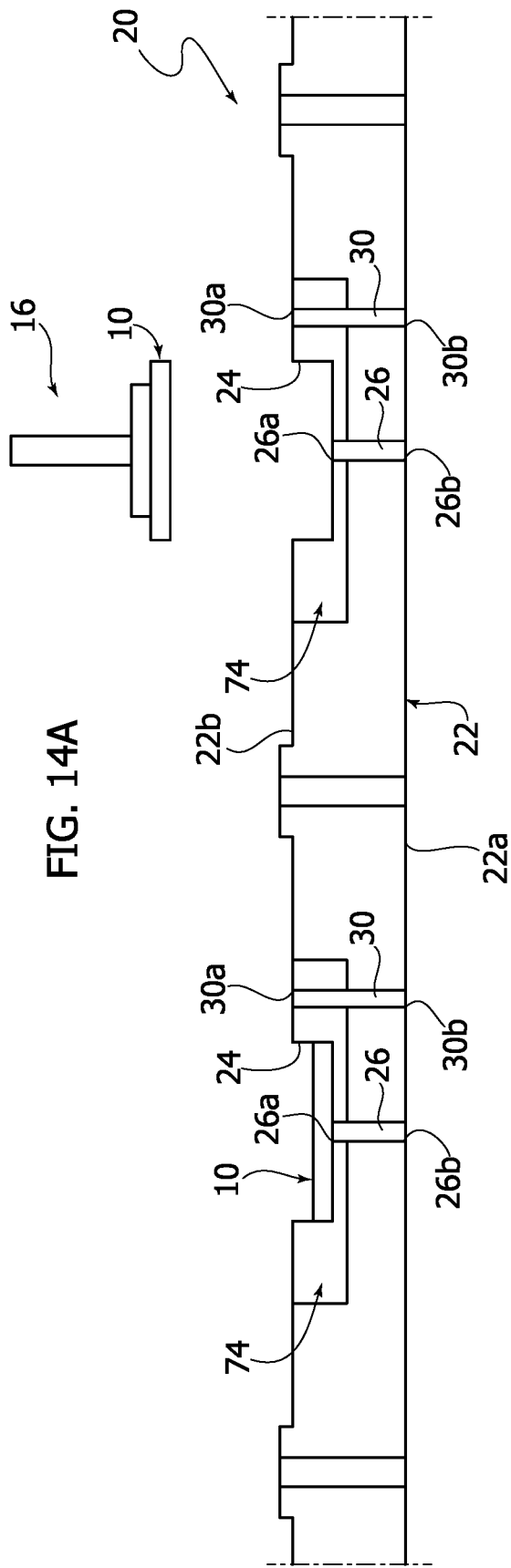
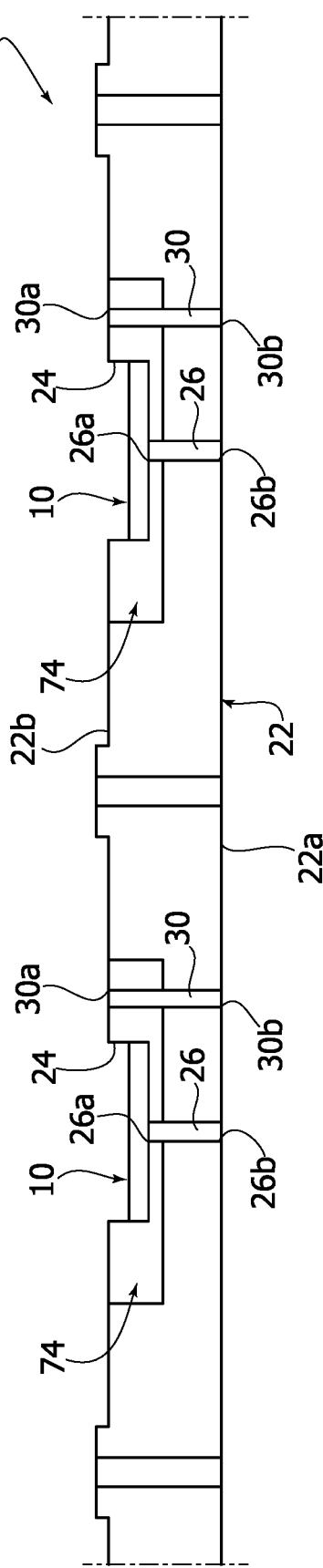
FIG. 14A
FIG. 14B

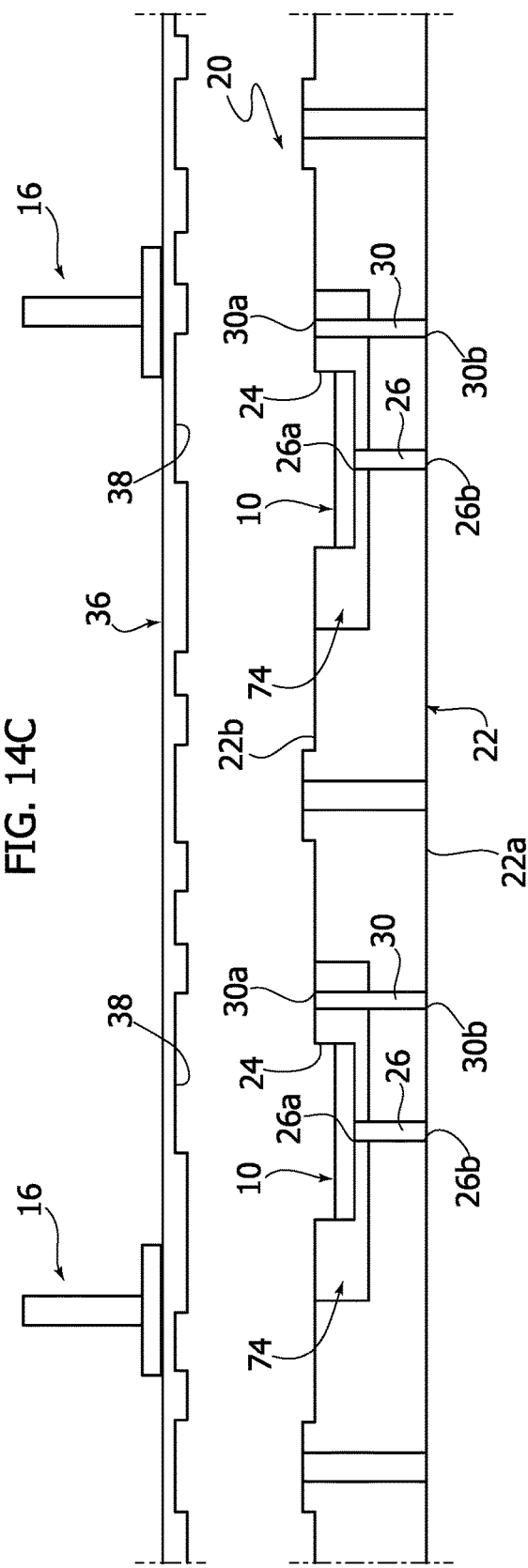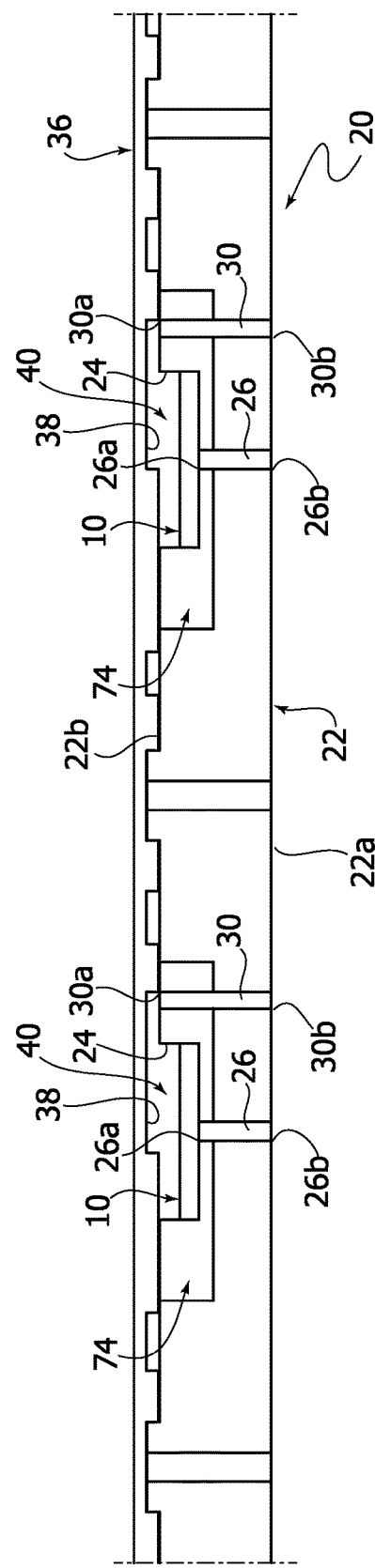

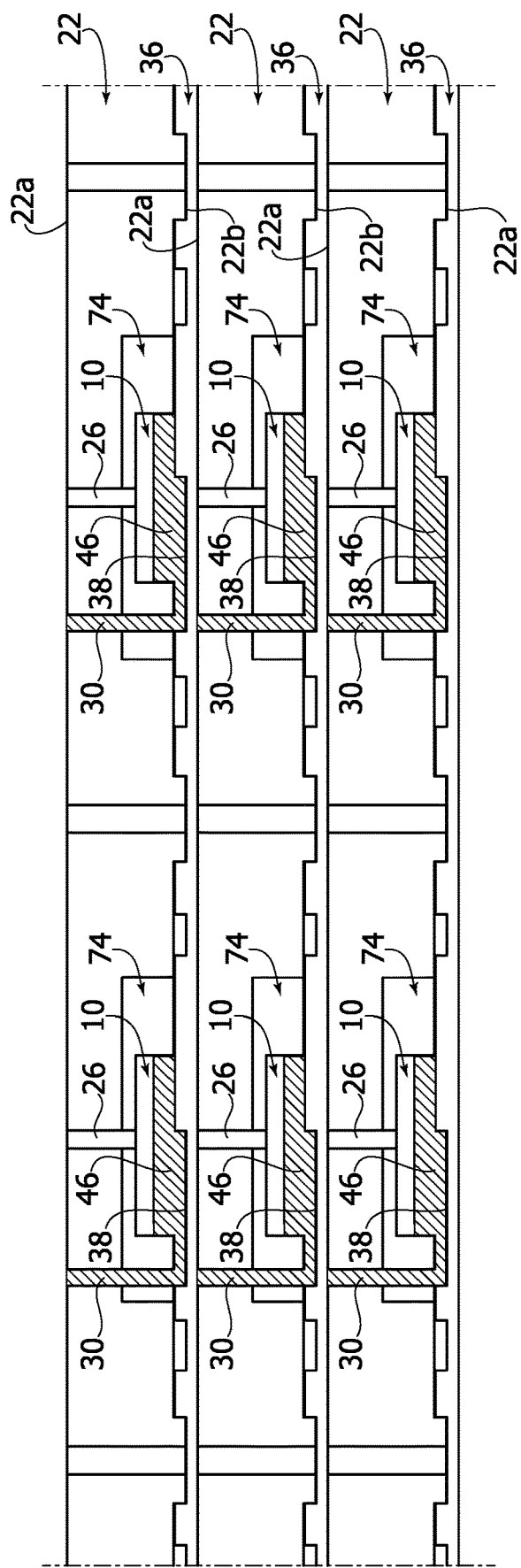
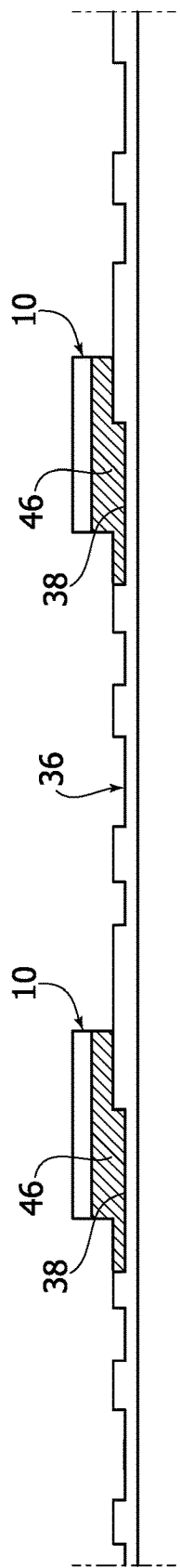
FIG. 14G
FIG. 14H

METHOD OF MANUFACTURING SEMICONDUCTOR DEVICES AND CORRESPONDING DEVICE

PRIORITY CLAIM

This application claims the priority benefit of Italian Application for Patent No. 102020000020386, filed on Aug. 24, 2020, the content of which is hereby incorporated by reference in its entirety to the maximum extent allowable by law.

TECHNICAL FIELD

The description relates to manufacturing semiconductor devices.

One or more embodiments may be applied, for instance, to manufacturing semiconductor devices such as integrated circuits (ICs).

BACKGROUND

Manufacturing semiconductor devices, such as integrated circuits (ICs), is an area of technology which has attracted extensive research activity, as witnessed by extensive technical and patent literature.

Despite the extensive activity in that area, further improved solutions are desirable.

There is a need in the art to contribute in providing improved solutions in the manufacture of semiconductor devices.

SUMMARY

One or more embodiments may relate to a method.

One or more embodiments may relate to a corresponding device.

One or more embodiments may provide various types of improvement e.g. in semiconductor device manufacturing.

For instance, one or more embodiments may provide one or more of the following advantages: reduced deformation of semiconductor chips or dice arranged on substrates such as leadframes, primarily when the thickness of the semiconductor chips or dice is small; improved adhesion of glue dispensed on substrates; reduced spilling of glue provided at interfaces between semiconductor chips or dice and substrates over (front or top) surfaces of semiconductor chips or dice, primarily when the thickness of such semiconductor chips or dice is small; controlled-size application of glue at interfaces between semiconductor chips or dice and substrates; and reduction of the time involved in arranging and attaching semiconductor chips or dice on substrates.

One or more embodiments may be used on QFN (Quad-Flat No-lead) VIPower (Vertical Intelligent Power) products, optionally comprising dice having small thickness, e.g., 110 µm.

One or more embodiments may be used on UQFN (Ultra-thin Quad-Flat No-lead) MR (multi-row) products, optionally comprising dice having small thickness, e.g., 145 µm.

One or more embodiments may be used on MEMS (Micro Electro-Mechanical Systems) products.

BRIEF DESCRIPTION OF THE DRAWINGS

One or more embodiments will now be described, by way of example only, with reference to the annexed figures, wherein:

FIGS. 14A to 14H are exemplary of possible steps of an embodiment of a method.

Figure 1A:
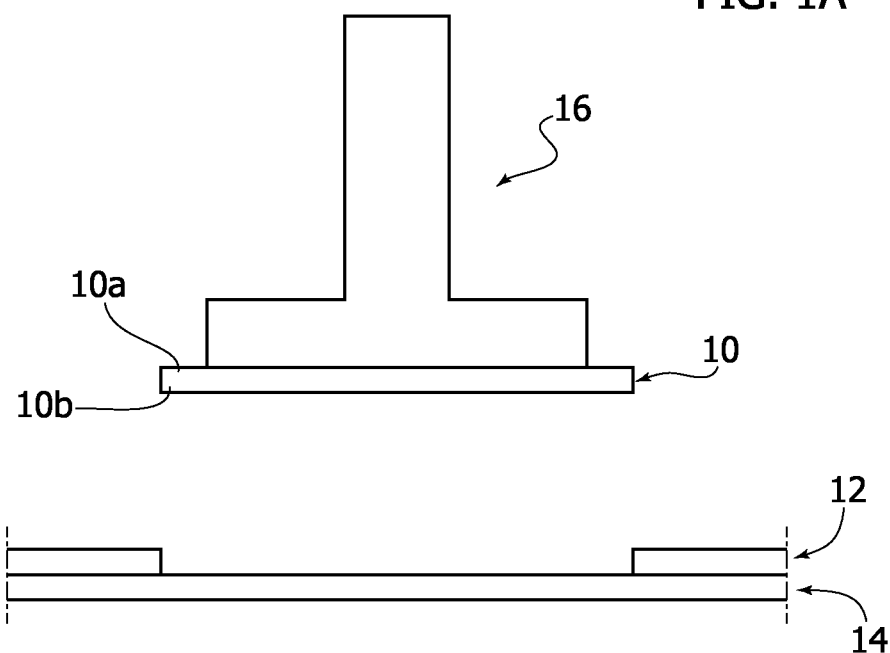
FIGS. 1A to 1G are exemplary of possible steps in an embodiment of a method.

It will be appreciated that for the sake of clarity and ease of understanding the various figures may not be drawn to a same scale.

DETAILED DESCRIPTION

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular conformations, structures, or characteristics may be combined in any adequate way in one or more embodiments.

The headings/references used herein are provided merely for convenience and hence do not define the extent of protection or the scope of the embodiments.

Throughout the figures annexed herein, like parts or elements are indicated for simplicity with like references/numerals and a corresponding description will not be repeated for each and every figure for brevity.

By way of introduction to the instant detailed description of exemplary embodiments, certain basic concepts of semiconductor device manufacturing will be briefly recalled, along with certain critical issues related thereto.

Semiconductor devices may comprise one or more semiconductor chips or dice arranged (attached) on substrates such as leadframes.

The designation "leadframe" (or "lead frame") is currently used (see, for instance the USPC Consolidated Glossary of the United States Patent and Trademark Office) to indicate a metal frame which provides support for an integrated circuit chip or die as well as electrical leads to interconnect the integrated circuit in the die or chip to other electrical components or contacts.

Glue may be provided at interfaces between semiconductor chips or dice and leadframes or substrates in order to facilitate mutual adhesion.

Arranging and attaching a semiconductor chip or die on a leadframe or substrate may comprise steps such as: providing glue at the portion of the leadframe or substrate where the semiconductor chip or die is intended to be arranged, and arranging the semiconductor chip or die on such glue.

Electrical connection between leadframes or substrates and semiconductor chips or dice attached thereon may be provided in the form of metal wiring (so-called wire-bonding technology may be exemplary of such an approach).

An insulating compound (an epoxy molding compound, for instance) may be molded onto a leadframe or substrate to encapsulate a semiconductor die or dice arranged thereon.

Arranging a semiconductor chip or die on glue provided on a substrate such as a leadframe may be challenging when the thickness of the semiconductor chip or die is small, for example in the instance of vertically integrated photodiode (VIP) technology.

Technologies such as VIP may involve using semiconductor chips or dice having thicknesses as low as 120 µm, that is, more or less the thickness of a sheet of paper. This was found to facilitate obtaining low electrical resistance in the Z direction and power dissipation in components such as metal oxide semiconductor field-effect transistors (MOSFETs).

Arranging a semiconductor chip or die having a reduced thickness on glue provided on a substrate such as leadframe was found to be exposed to the risk of air undesirably entrapped in the glue. Entrapped air may facilitate deforming the semiconductor chip or die, with an increase in electrical resistance. Also, deformation of the semiconductor chip or die may negatively affect device performance, for instance in Micro Electro-Mechanical Systems (MEMS) sensor applications.

Moreover, arranging a semiconductor chip or die having a reduced thickness on glue provided on a substrate such as a leadframe may lead to undesired spilling of the glue over the (front or top) surface of the semiconductor chip or die. For instance, contact pads formed at that surface may be covered by glue spilled thereon, which may militate against providing electrical connections between the semiconductor chip or die and the leads in a leadframe.

Additionally, after an encapsulating (insulating) compound is molded onto the semiconductor chip or die attached onto a substrate such as a leadframe, delamination may occur at the interface between the insulating compound and the glue spilled over the (front or top) surface of the semiconductor chip or die, which may be evidenced by thermo-cycling (TC) tests. Undesired separation of the insulating compound and the semiconductor chip or die may thus result.

It is noted that standoff spheres may be embedded in the glue provided on the leadframe or substrate in order to facilitate controlling its bond line thickness (BLT). However, this was found to possibly result in so-called "channel voids" formed in the glue, which in turn may contribute to undesired spilling of the glue over the (top) surface of the semiconductor chip or die.

It is noted that controlling glue application just under the die may facilitate reducing the glue/mold interface area, thus reducing the occurrence of delamination at the interface between the insulating compound and the glue.

Attempts to address the above-mentioned drawbacks may involve replacing the glue at the interface between the semiconductor chip or die and a substrate such as a leadframe with material comprising conductive die attach film (CDAF).

However, CDAF material may be expensive (approximately twice the price of glue) and such material may exhibit low thermal conductivity, for example, 1 W/M° K.

Glue screen printing may be considered as well. However, this may involve screen printable glue, which may result in increased sensitivity to deformation of the semiconductor chip or die and to glue floor time.

Also, advanced dispense may be considered as a way to address the above-mentioned drawbacks. However, such approach may be related to low capacity due to square spiral dispense layout on large semiconductor chips or dice.

Compared with glue screen printing and/or advanced dispense, one or more embodiments may reduce the time involved in arranging and attaching semiconductor chips or dice on substrates such as leadframes in semiconductor device manufacturing while reducing the risk of glue spilling over the (top) surfaces of semiconductor chips or dice via controlling glue dispensing.

In one or more embodiments, controlling the amount (size) of glue may be facilitated by dispensing glue material in a confined chamber formed at the interface between a semiconductor chip or die and a leadframe or substrate.

FIG. 1A is exemplary of the act of picking up a semiconductor die or chip 10 from a diced wafer 12, optionally arranged on an adhesive strip 14.

As illustrated, the semiconductor die or chip 10 may comprise: a first (front or top) surface 10a, hereinafter referred to also as "active surface", having a plurality of pads formed thereon (these are not visible in the figure for the sake of simplicity), and a second (back or bottom) surface 10b, opposite the first surface 10a, hereinafter referred to also as "inactive surface".

As illustrated, in manner per se known in the art, the semiconductor die or chip 10 may be picked up from the diced wafer 12 resorting to a picking device or tool 16.

For instance, one or more ducts (not visible for simplicity) may be provided between opposite faces of the picking device 16 through which a sub-atmospheric pressure can be applied to facilitate picking up the semiconductor chip or die 10 from the diced wafer 12 by vacuum action.

Figure 1B:
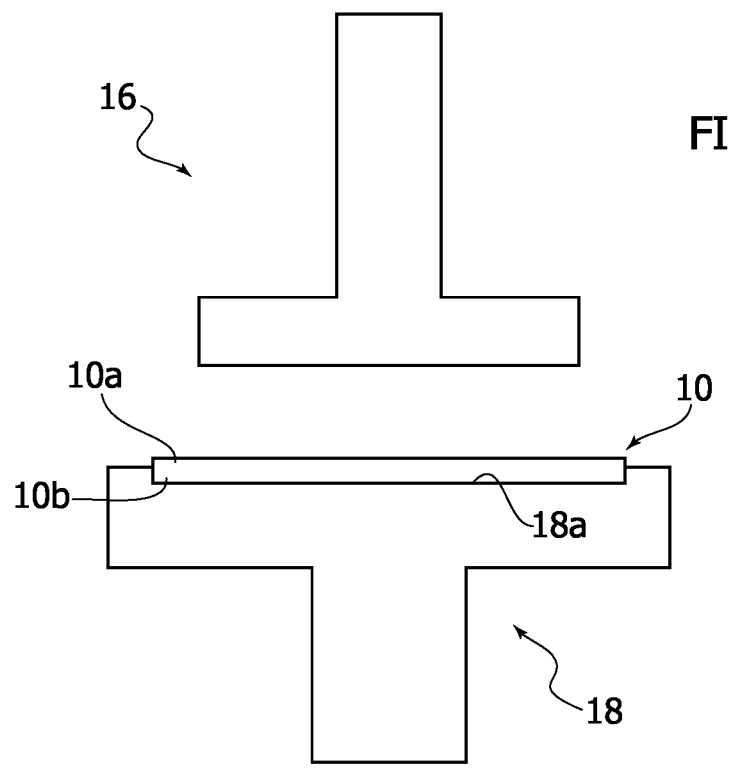

FIG. 1B is exemplary of the possibility of using the picking device 16 to arrange the semiconductor chip or die 10 in a support structure 18 provided with some sort of sculpturing, such as a recessed portion 18a, in order to facilitate (accurate) positioning of the semiconductor die or chip 10.

As illustrated, the depth of the recessed portion 18a may be lower than the thickness of the semiconductor die or chip 10, so that the active surface 10a of the semiconductor die or chip 10 at least marginally protrudes from the support structure 18.

Figure 1C:
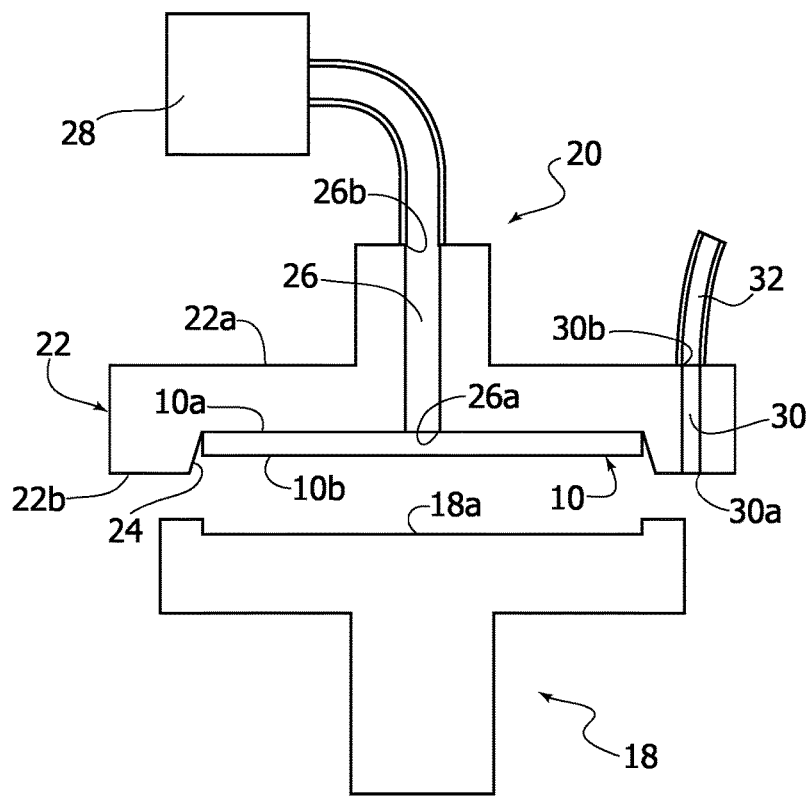

This may facilitate picking up the semiconductor die or chip 10—accurately positioned in the support structure 18—by a chip holding device or tool 20 in FIG. 1C.

It will be otherwise appreciated that, while advantageous, the steps illustrated in FIGS. 1A to 1C are not mandatory. For instance, in certain embodiments, the tool 20 may be used directly to pick the semiconductor die or chip 10 from the diced wafer 12.

As illustrated in FIG. 1C, the holding device 20 may comprise a prismatic body portion 22, optionally square-based or rectangular-based. The prismatic portion 22 may comprise a first (upper) face 22a, a second (lower) face 22b and a plurality of (for instance, four) side faces 22c.

As illustrated, a sculptured formation 24 such as a recess may be provided at the second (lower) face 22b of the prismatic portion 22 with one or more, optionally cylindrical, ducts 26—hereinafter referred to as "main" ducts—extending through the body of the holding device 20 with a first end 26a at the sculptured formation 24 and a second end 26b, opposite the first end 26a.

A duct 26 as illustrated can extend through a central hub portion of the body of the holding device 20. Two or more such (main) ducts 26 may be formed in the body of the holding device 20, for instance at a more peripheral location of the body of the holding device 20.

In the following description only one main duct 26 as illustrated will be considered for simplicity having its second end 26b suited to be coupled to a source of sub-atmospheric pressure such as a vacuum pump 28.

As illustrated, in one or more embodiments, in addition to the "main" duct or ducts 26, one or more further "secondary" ducts 30 may be formed in the holding device 20.

As illustrated, the secondary duct(s) 30 may be optionally cylindrical and extend through the prismatic body portion 22 of the device 20 at least between the first (upper) face 22a and a portion of the second (lower) face 22b surrounding the sculptured formation 24.

The secondary duct(s) 30 may have a first end 30a at a portion of the second (lower) face 22b surrounding the sculptured formation 24, and a second end 30b at the first (upper) face 22a. Consequently, the first end 30a of the secondary duct(s) 30 will be arranged at a more "external" position with respect to the body of the device 20 in comparison with the first end 26a of the main duct(s) 26 which opens out in the (recessed) sculptured formation 24.

Again, while two or more secondary ducts 30 may be formed in the holding device 20, in the following description only one secondary duct 30 will be considered for simplicity.

As exemplified herein, a tube 32 (of plastic material, for instance) can be connected to the second end 30b of the secondary duct 30 for coupling to a container 44 containing glue 46 as discussed in the following.

Figure 3A:
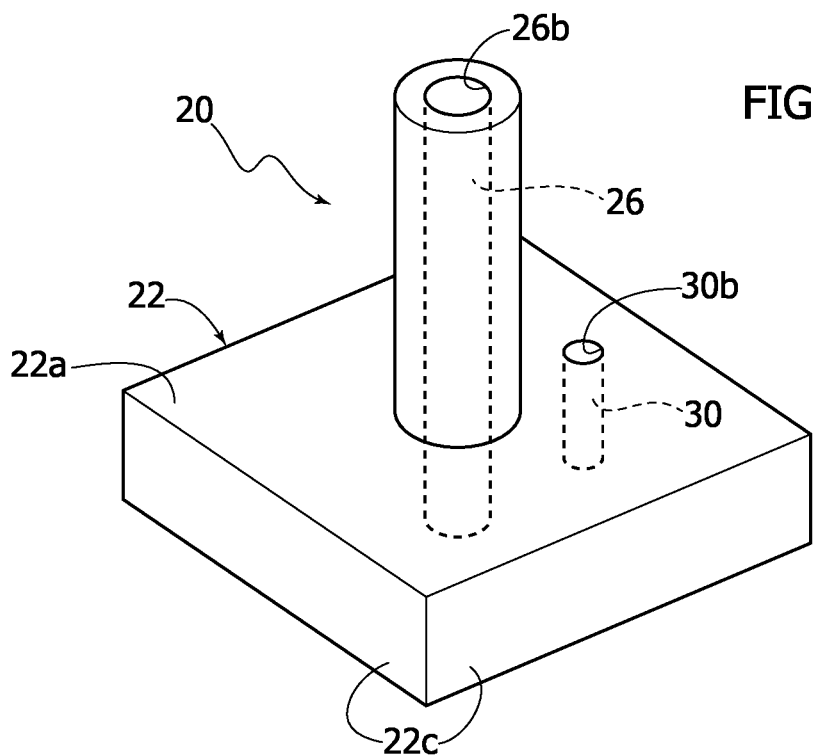
FIGS. 3A and 3B are perspective views of a holding device which may be used in embodiments.
Figure 3B:
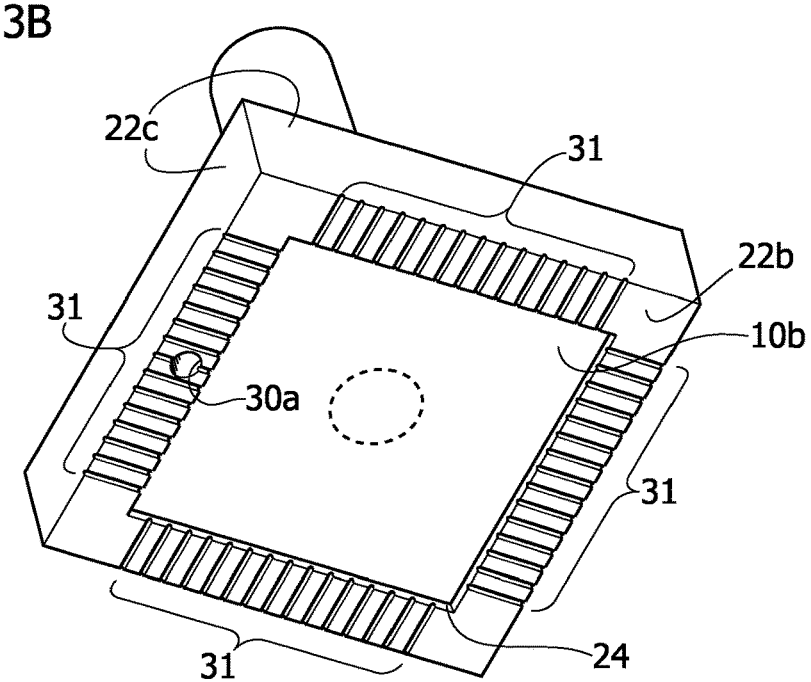

As discussed in the following in connection with FIG. 3B, a plurality of channels (half-cylindrical grooves) 31 may be formed in the holding device 20 at one or more portions of the second (lower) face 22b surrounding the recessed sculptured formation 24. As illustrated, the grooves 31 (not visible in the other figures for simplicity) may extend between the sculptured formation 24 and the side faces 22c of the prismatic portion 22.

As illustrated, the main duct(s) 26 and the secondary duct(s) 30 may extend in directions substantially parallel to each other, while the grooves 31 may extend in a plane substantially perpendicular to the directions of the main duct 26 and of the secondary duct 30.

As exemplified in FIG. 1C, picking up the semiconductor chip or die 10 via the holding device or tool 20 may comprise (possibly after positioning the holding device 20 above the support structure 18): arranging the sculptured formation 24 of the holding device 20 at the front or top surface of the semiconductor chip or die 10 arranged thereon; actuating the pump 28 to apply sub-atmospheric pressure (vacuum) to the duct(s) 26, so that the semiconductor chip or die 10 is retained at the sculptured formation 24; and lifting the holding device 20 having the semiconductor chip or die 10 held at the sculptured formation 24.

As illustrated, the height or depth of the recessed sculptured formation 24 may be higher than the thickness of the semiconductor chip or die 10 so that the semiconductor chip or die 10 may thus be entirely received within the sculptured formation 24. The semiconductor chip or die 10 may thus be entirely recessed with respect to the plane of the grooves or channels 31.

Figure 1D:
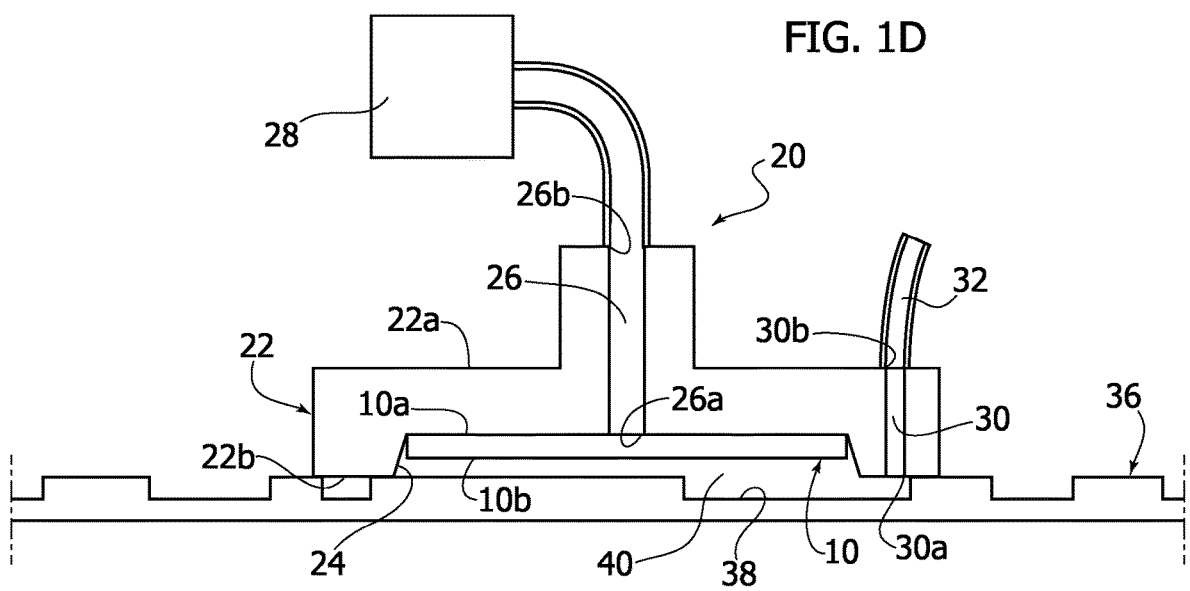
Figure 4:
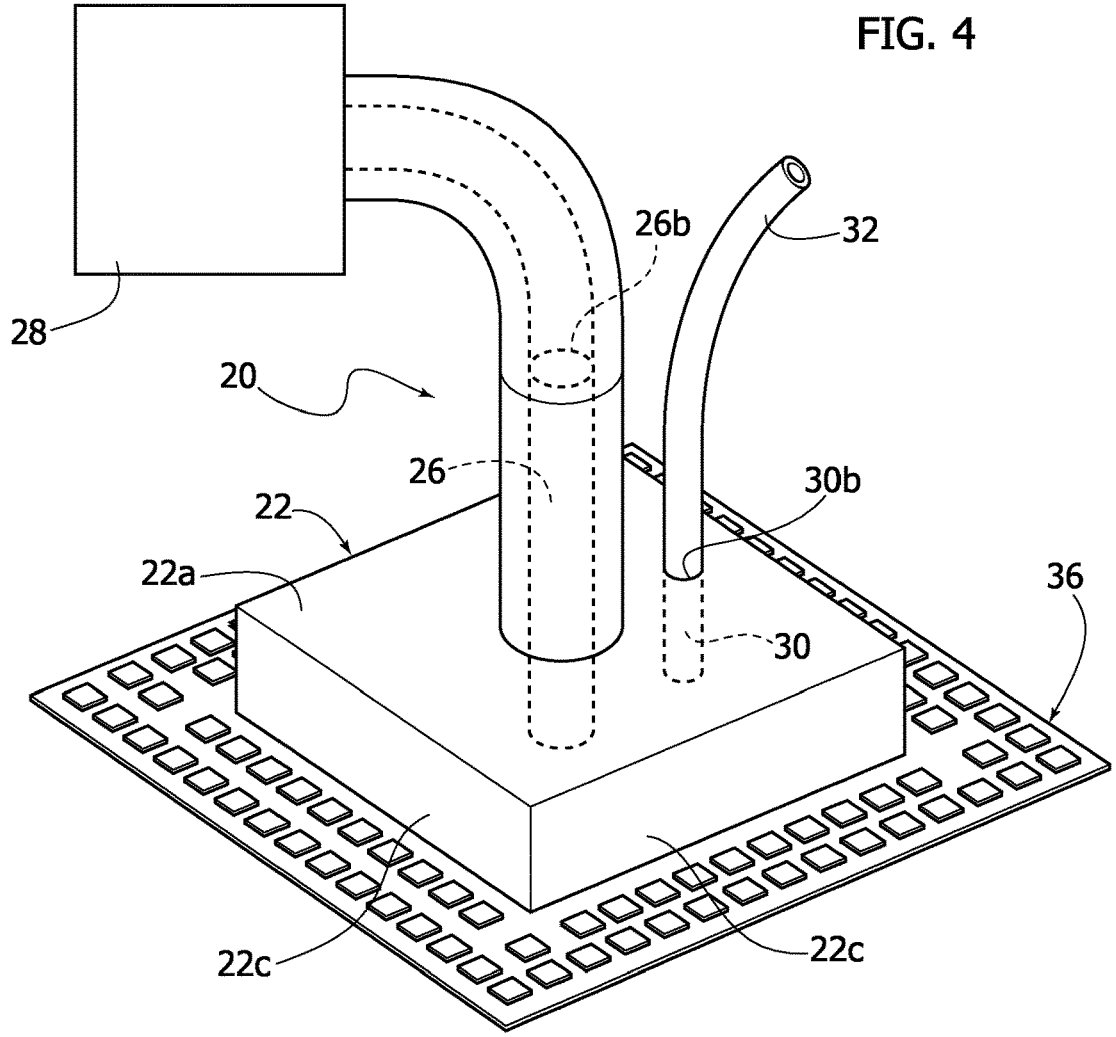
FIG. 4 and FIGS. 5A-5B are a perspective view and side elevational views exemplary of a possible use of the device of FIGS. 3A and 3B.

As illustrated in the sequence of FIGS. 1C and 1D, once lifted from the support structure 18, the holding device 20, having the semiconductor chip or die 10 held at the sculptured formation 24 can be arranged above a leadframe 36 at a position where the semiconductor chip or die 10 is intended to be mounted (see also the perspective view of FIG. 4 to be discussed in the following).

As noted, "leadframe" (or "lead frame") is a conventional designation for a metal frame which provides support substrate for an integrated circuit chip or die such as 10 as well as electrical leads to interconnect the integrated circuit in the die or chip to other electrical components or contacts.

Essentially, a leadframe comprises an array of electrically-conductive formations (leads) which from an outline location extend inwardly in the direction of a semiconductor chip or die thus forming an array of electrically-conductive formations from a die pad.

As conventional in the art, such a leadframe 36 may be provided in the form of a strip of notionally indefinite length where a plurality of devices is formed, with the individual devices thus formed finally separated by a final "singulation" operation. To that effect the leadframe 36 may be provided along its length with fiducials, not visible in the figures for simplicity.

In the following, only a portion of leadframe 36 intended to host a single chip or die such as 10 will be considered (and illustrated in figures such as FIGS. 2A to 2C, 4, 6A, 6B, 7A, 7B, 9A, 9B, 11A, 11B, 13A, 13B).

In one or more embodiments, one or more etched portions 38 may be formed on a (upper or top) surface of the leadframe 36. In the following, only one etched portion 38 formed on the leadframe 36 will be considered for simplicity.

As illustrated in FIG. 1D, the device 20 may be arranged on the leadframe 36 so that at least part of the sculptured formation 24 (with the chip or die therein) and the first end 30a of the secondary duct 30 are positioned at the etched portion 38 so that (as visible also in the plan view of FIG. 2A) a confined (substantially closed) chamber 40 is formed at the interface between the semiconductor chip or die 10 and the leadframe 36 surrounded by the periphery of the device 20 (where the grooves 31 are provided).

As exemplified by the sequence of FIGS. 1E-1F and FIGS. 2B-2C, die attach glue 46 from the container 44 can be dispensed (by gravity or as a result of positive pumping action) into the chamber 40 to facilitate attaching the semiconductor die or chip 10 on the leadframe 36.

From the container 44, the glue 46 (of any known type to those of skilled in the art for die attachment purposes) may flow through the secondary duct 30 to the etched portion 38 of the leadframe 36 to fill the interface between the semiconductor chip or die 10 and the leadframe 36 thus providing adhesion between the semiconductor chip or die 10 and the leadframe 36 as desired.

As noted, while confined (that is being a volume or cavity delimited by confining surfaces or walls), the chamber 40 is not completely (sealingly) closed due to the presence of the channels provided by the grooves 31: these channels may facilitate exit from the chamber 40 of air which is replaced (and thus "expelled") by glue 46 flowing into the chamber 40.

The small cross-section of the channels 31 otherwise counters any undesired spilling of glue 46 out of the chamber 40.

In one or more embodiments, dispensing the glue 46 in the confined chamber 40 via the device 20 may facilitate: controlling the amount (size) of glue 46 dispensed at the interface between the semiconductor chip or die 10 and the leadframe 36; countering formation of so-called "channel voids" at the interface between the semiconductor chip or die 10 and the leadframe 36; countering spilling of glue 46 over the active (top) surface 10*a* of the semiconductor chip or die 10, thus reducing the risk of undesired spilling of glue 46 over the pads thereon which may adversely affect electrical connection between such pads and the leadframe 36; and reducing (to 3 seconds, for instance) the time involved in dispensing glue 46 at the interface between the semiconductor chip or die 10 and the leadframe 36.

Figure 1E:
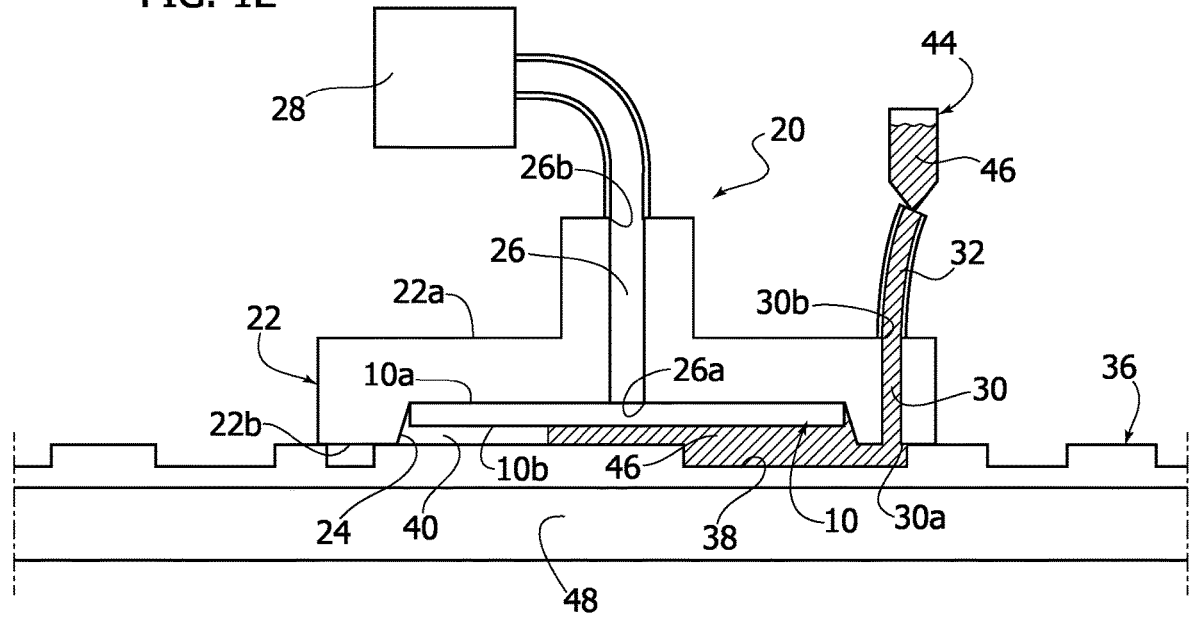
Figure 1F:
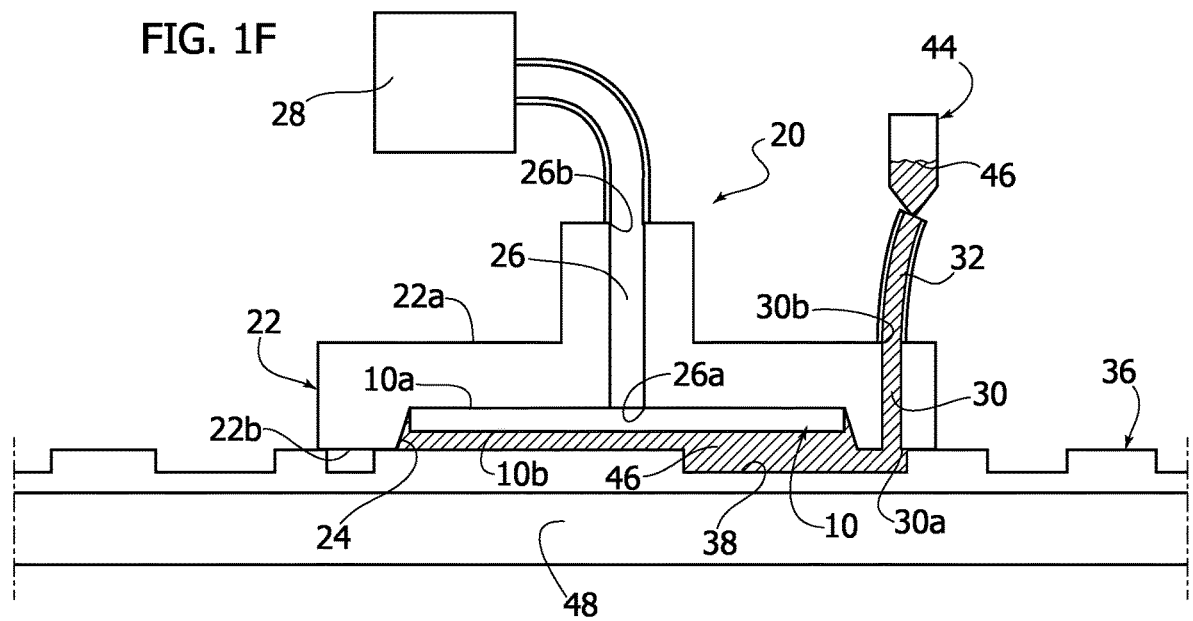

As illustrated in FIGS. 1E and 1F, the leadframe 36 having the device 20 positioned thereon may be located at a heating surface 48 (a plate, for instance).

The surface 48 can be heated to a temperature (moderately) higher than room temperature—60° C., for instance—in order to further reduce the time involved in dispensing glue 46 at the interface between the semiconductor chip or die 10 and the leadframe 36 by reducing the viscosity of glue 46.

Figure 1G:
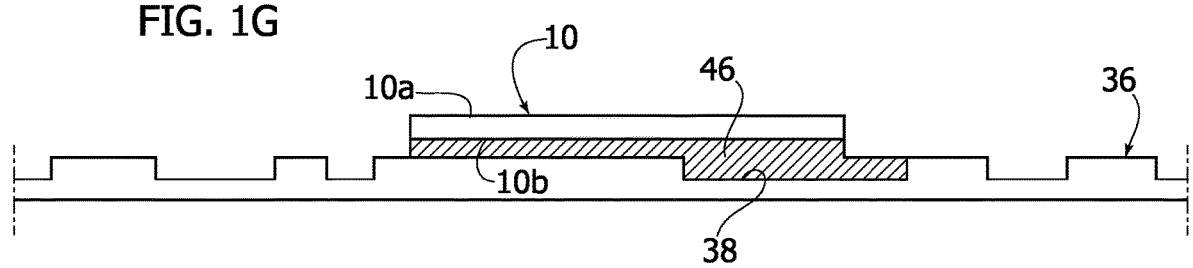

FIG. 1G is exemplary of the device resulting from the step of removing the holding device 20 from the leadframe 36 having the semiconductor die or chip 10 attached thereon by means of glue 46.

In one or more embodiments, the walls of the sculptured formation 24 of the holding device 20 may comprise polytetrafluoroethylene (PTFE or Teflon) or a similar release agent applied thereon. This may facilitate removing the device 20 from the leadframe 36, countering adhesion of glue 46 on the walls of the sculptured formation 24.

In one or more embodiments, curing the glue 46 dispensed at the interface between the semiconductor die or chip 10 and the leadframe 36 may be facilitated by placing the assembly as illustrated in FIG. 1G in an oven (not visible for simplicity), optionally heated at a temperature between 150° C. and 250° C.

As conventional in the art, electrical connection between the leadframe 36 and the semiconductor chip or die 10 attached thereon may be provided in the form of metal wiring (so-called wire-bonding technology may be exemplary of such an approach).

Figure 2A:
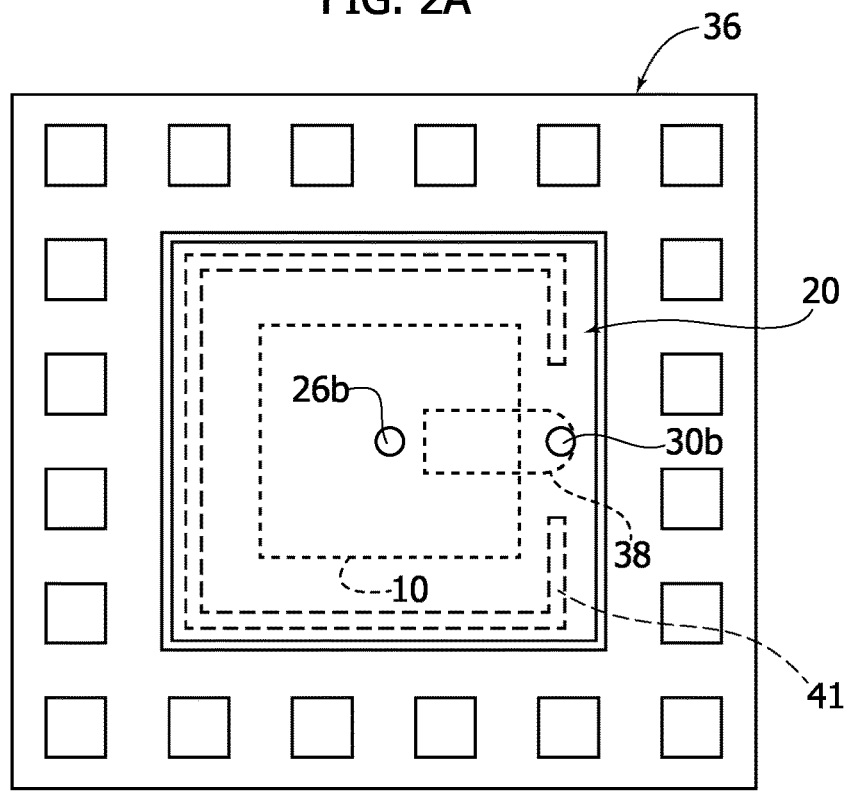
FIGS. 2A to 2C are plan views exemplary of results obtainable with steps in embodiments.
Figure 2B:
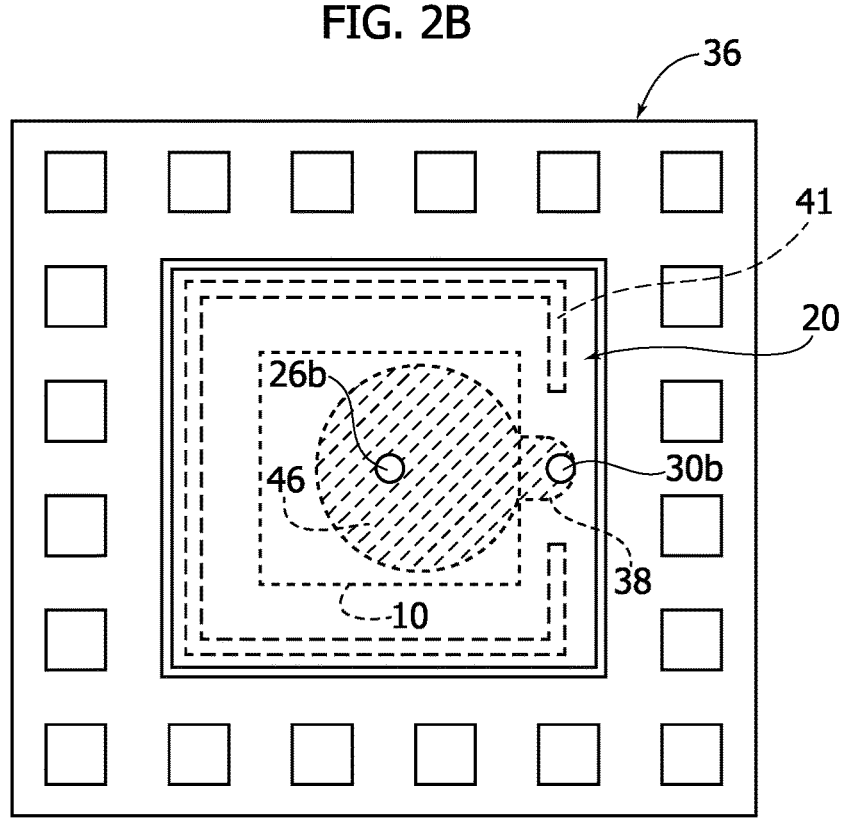
Figure 2C:
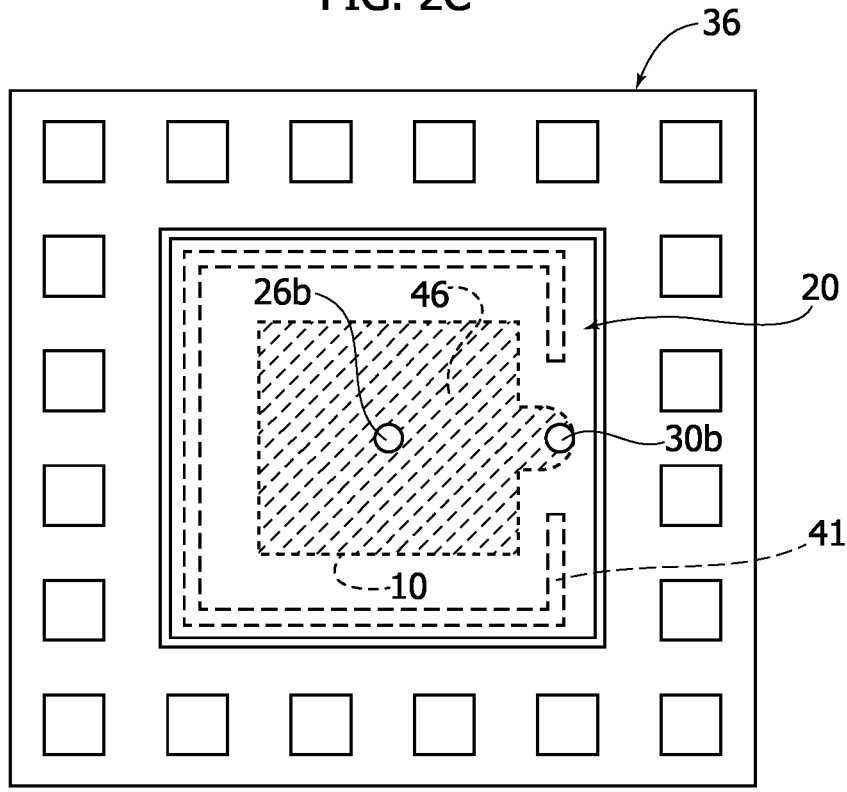

As conventional in the in the art, a molding compound may be molded onto the device resulting from the act of FIG. 1G. The molding compound may provide a (per se electrically-insulating) encapsulation of the semiconductor chip or die 10, possibly extending into the spaces between the leads and the die pad in the leadframe 36. As can be seen in FIGS. 2A-2C, a U-shaped channel 41 may be provided on the surface of the leadframe 36 to facilitate the adhesion of the molding compound.

The wiring and the molding compound are not visible in the figures for simplicity.

Figure 5A:
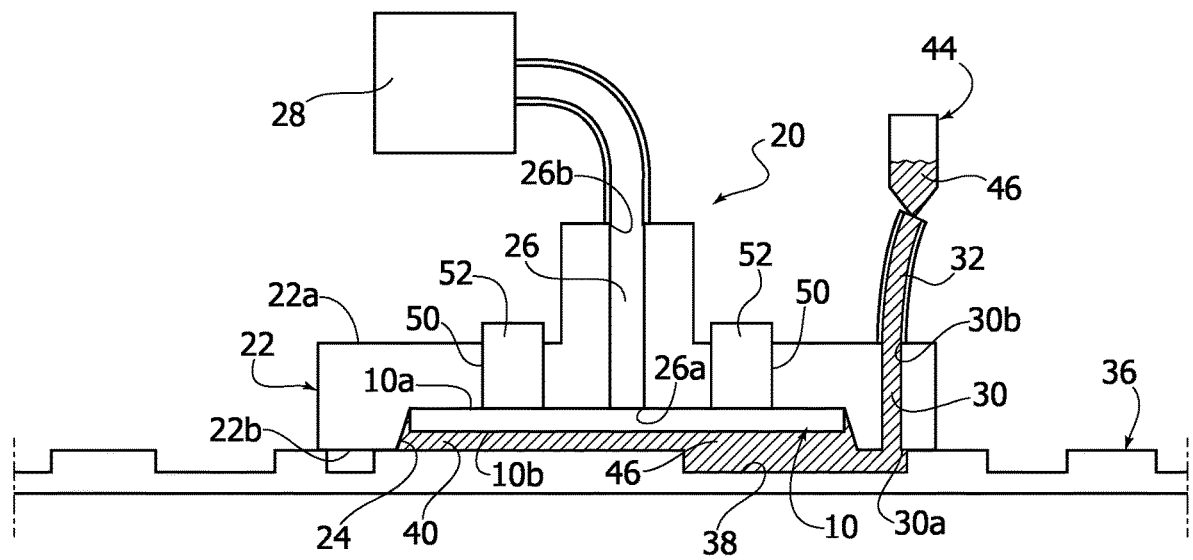
Figure 5B:
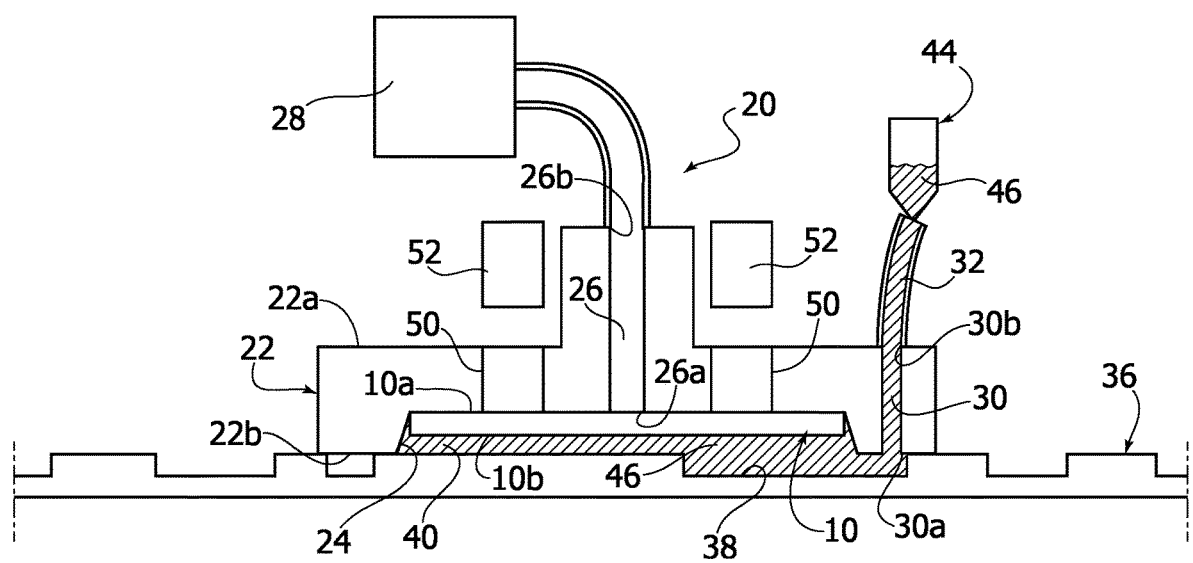

As exemplified in FIGS. 5A and 5B, in certain embodiments, one or more (further) heat sources 50 may be provided acting through the body of the device 20.

For instance, these heating sources may be arranged at one or more (further) ducts 50 extending between the first (upper) face 22*a* of the prismatic portion 22 and the sculptured formation 24.

The "heating" duct(s) 50 may be cylindrical and substantially parallel to the main duct(s) 26 and the secondary duct(s) 30.

Heating "elements" 52 (of a known type to those of skill in the art, illustrated extracted from the ducts 50 in FIG. 5B) may be arranged in the duct(s) 50 possibly contacting the active surface 10*a* of the semiconductor chip or die 10 held at the sculptured formation 24.

This may facilitate heating the semiconductor chip or die 10 and curing the glue 46 dispensed into the cavity 40 with the aim of countering undesired spilling (migration) of the glue 46 over the active surface 10*a* of the semiconductor chip or die 10, for instance when the device 20 is finally lifted from the leadframe 36.

In one or more embodiments, the heating element(s) 52 may be heated at a temperature between 150° C. and 170° C. The outer walls of the heating element(s) 52 may be thermally insulated to counter undesired heating of the walls of the heating duct(s) 50, which facilitates reducing the heating of the device 20.

Figure 6A:
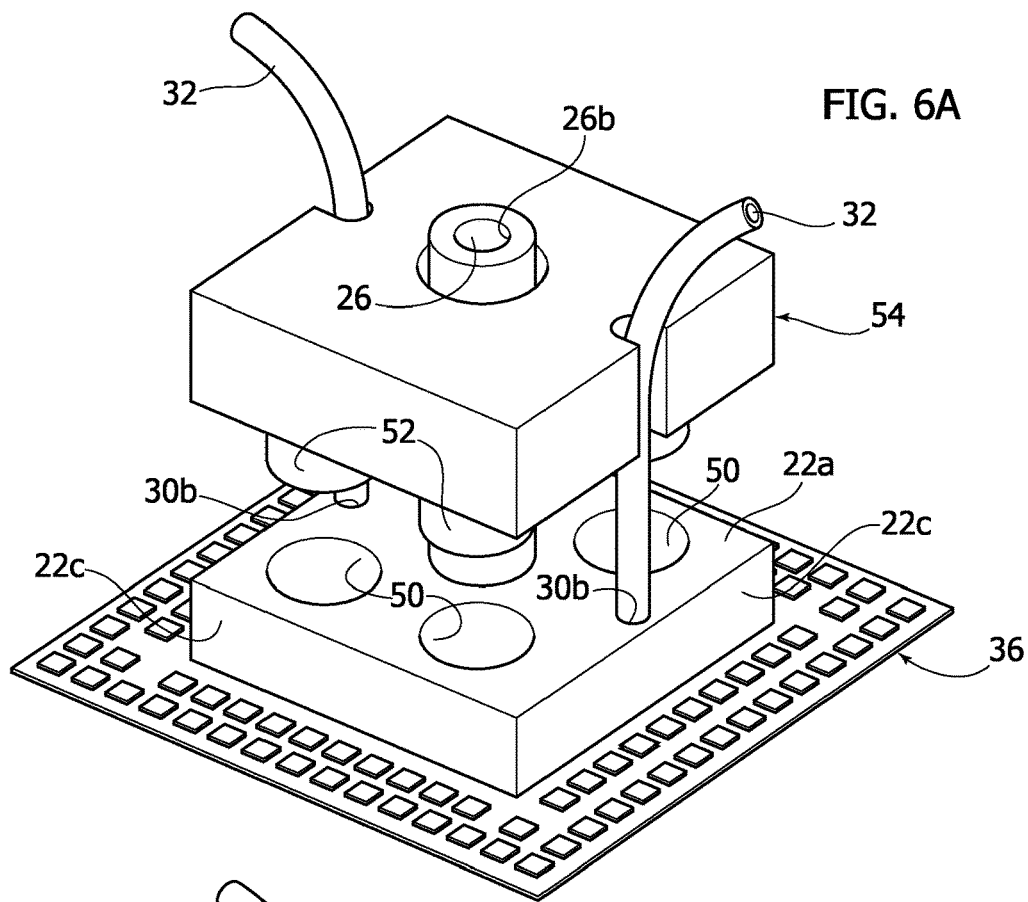
FIGS. 6A and 6B are perspective views exemplary of possible steps in an embodiment of a method.
Figure 6B:
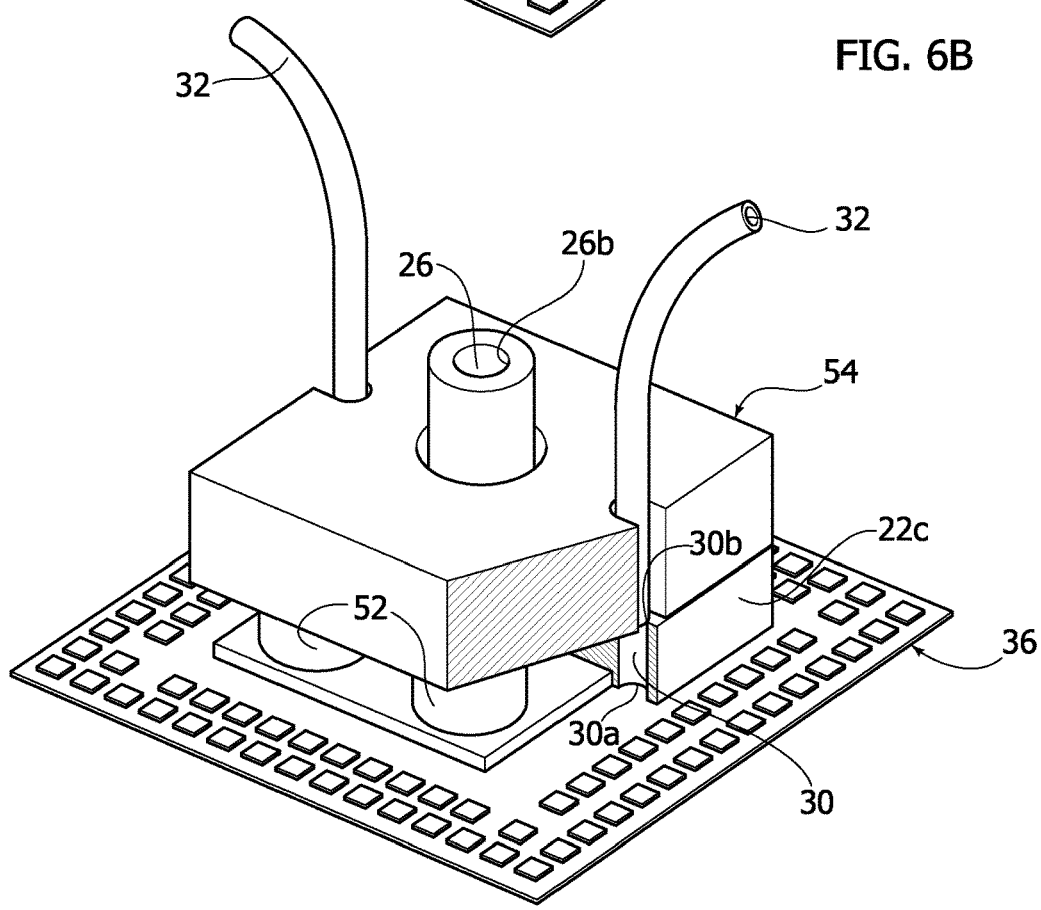

As exemplified in FIGS. 6A and 6B, in certain embodiments, the heating element(s) 52 may be coupled at one (upper) end to a support 54, which may be configured to be advanced towards the prismatic portion 22 of the device 20 to insert the heating element(s) 52 into the corresponding heating duct(s) 50.

As discussed, in one or more embodiments more than one etched portion 38 may be formed on the leadframe 36.

Figure 7A:
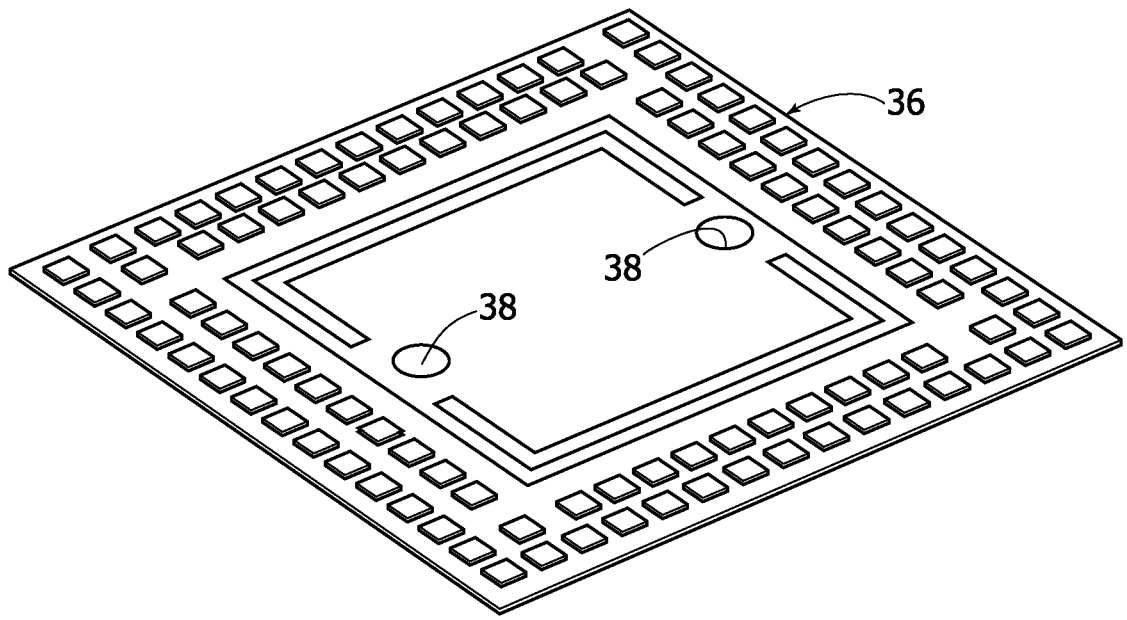
FIGS. 7A and 7B are perspective views of certain elements of leadframes in embodiments.

For instance, as exemplified in FIG. 7A, the leadframe 36 may comprise two etched portions 38. Dispensing glue 46 at each etched portion 38 (via a respective duct 30, for instance) may facilitate reducing the amount of time involved in dispensing glue 46 at the interface between the semiconductor chip or die 10 and the leadframe 36 in the confined chamber 40.

Figure 7B:
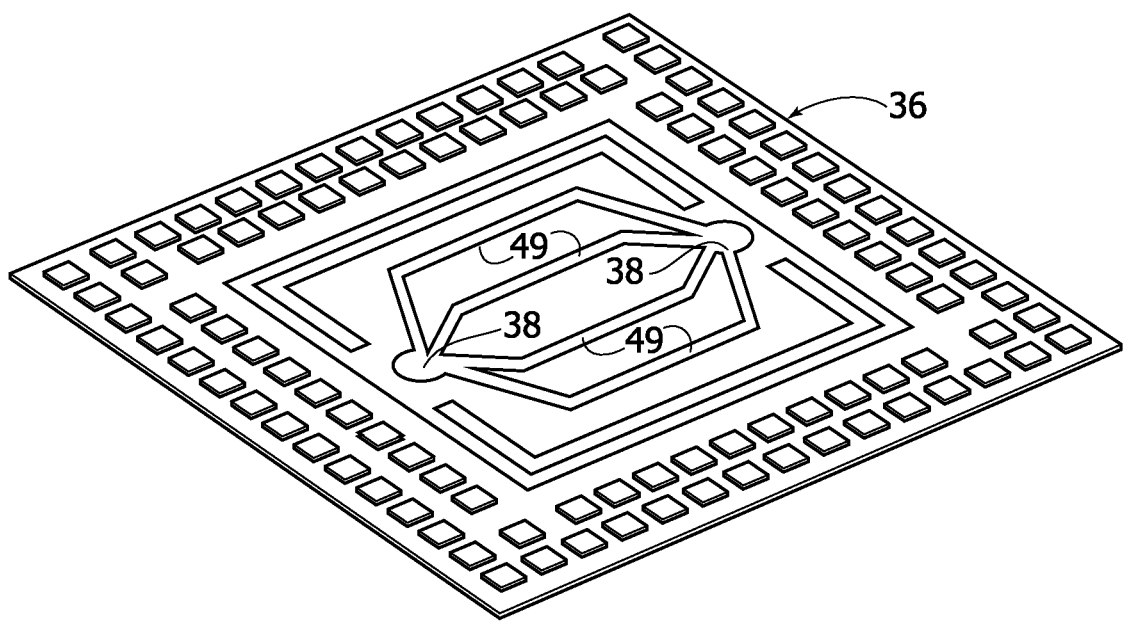

As exemplified in FIG. 7B, one or more channels 49 extending between the two etched portions 38 may be formed on the leadframe 36. The channel(s) 49 may facilitate improving the adhesion of glue 46 on the leadframe 36 and further reducing (to 1.5 seconds, for instance) the time involved in dispensing glue 46 at the interface between the semiconductor chip or die 10 and the leadframe 36 in the confined chamber 40.

Figure 8:
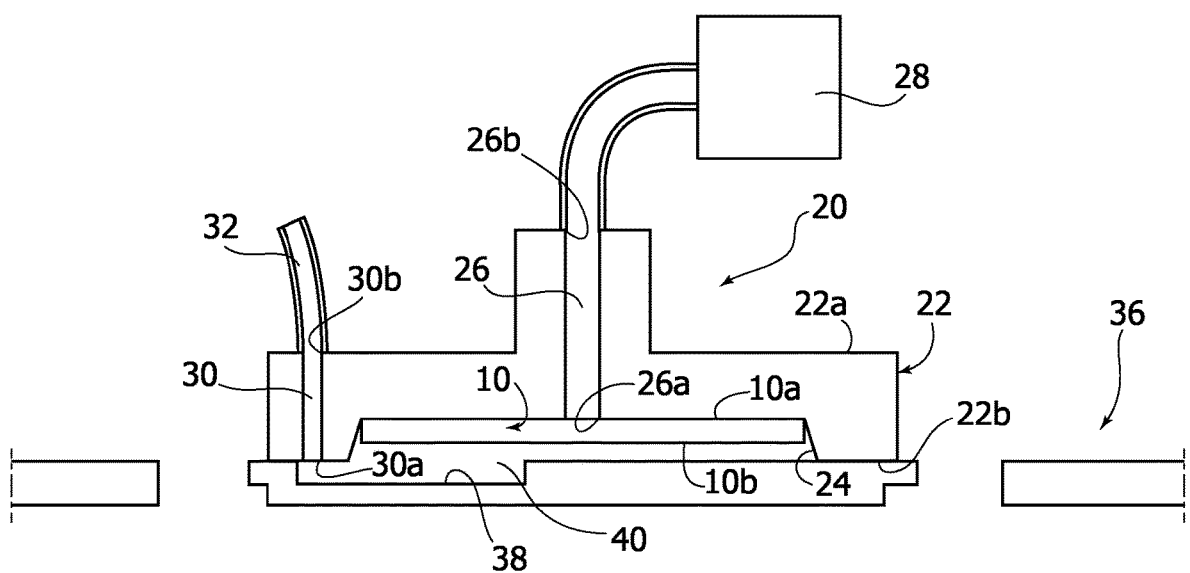
FIG. 8 is a side elevational view exemplary of possible steps in an embodiment of a method.
Figure 9A:
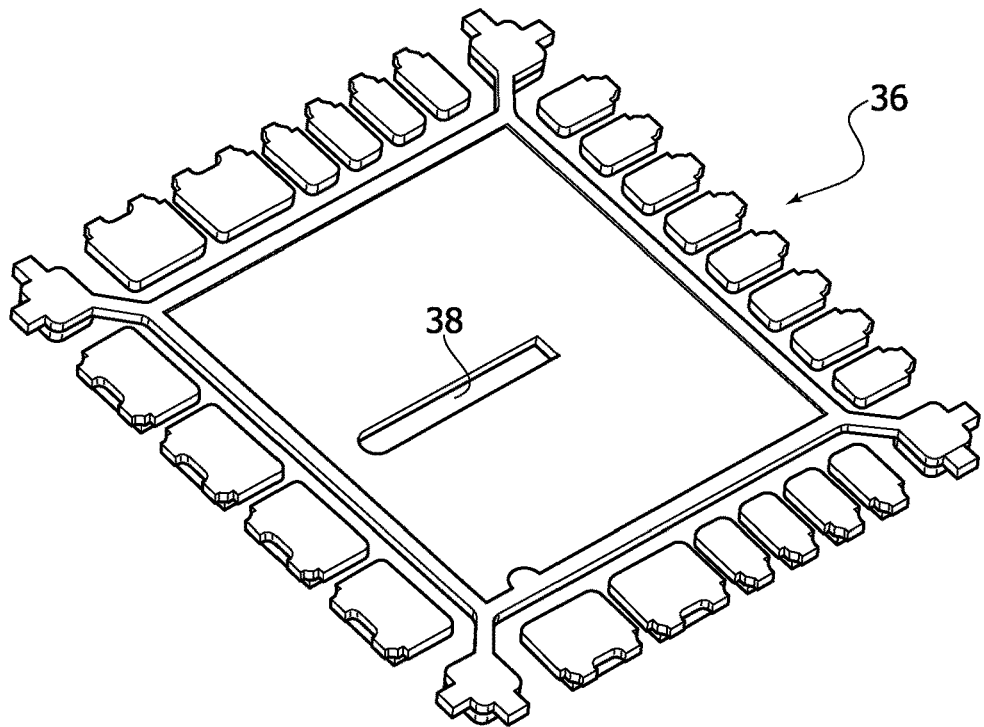
FIGS. 9A and 9B are perspective views of certain elements of a leadframe in embodiments.
Figure 9B:
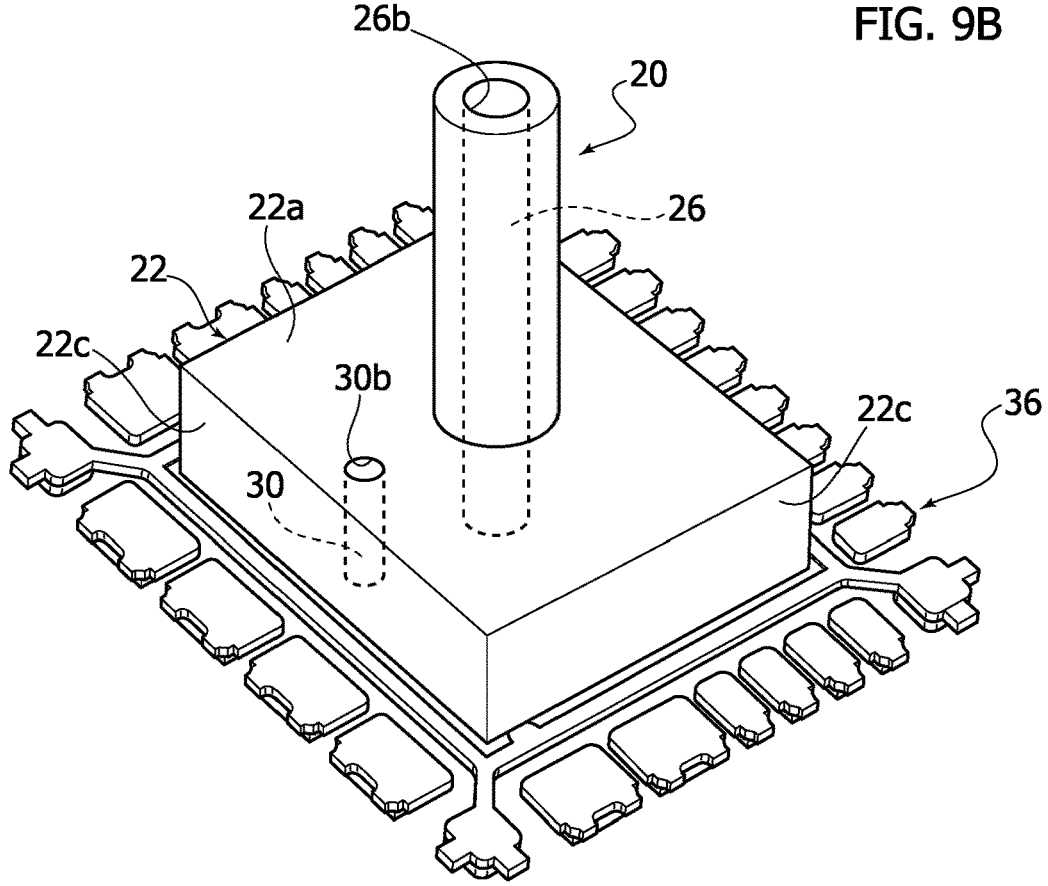
Figure 10:
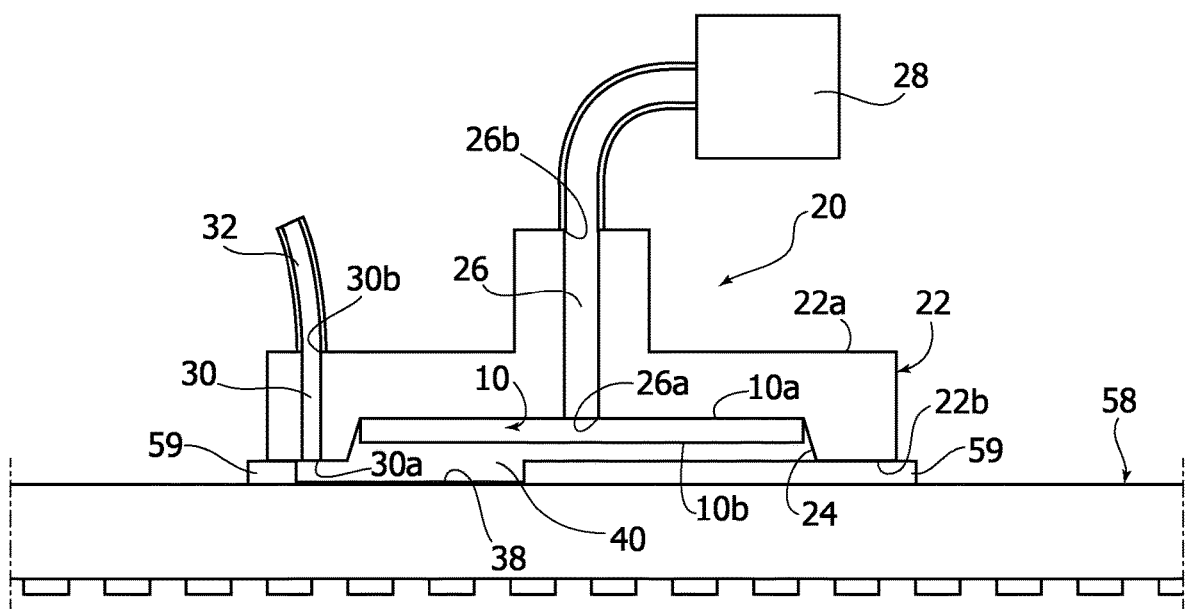
FIG. 10 is a side elevational view exemplary of possible steps in an embodiment of a method.
Figure 11A:
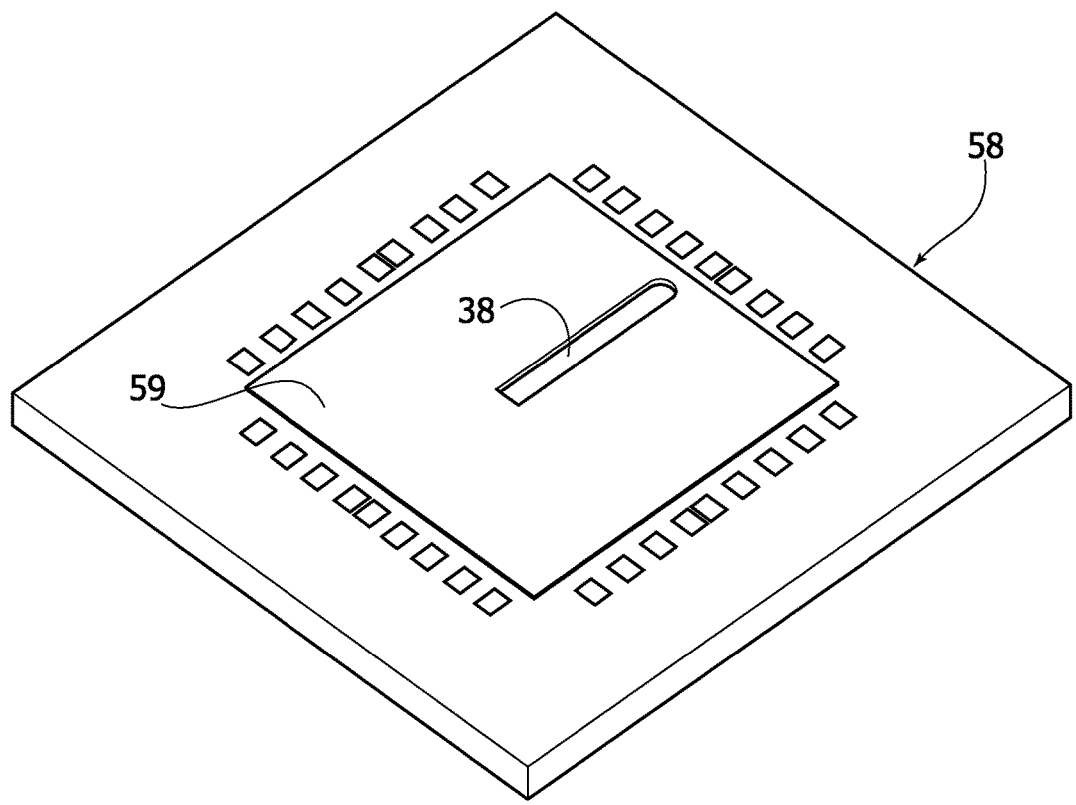
FIGS. 11A and 11B are perspective views of certain elements of a substrate in embodiments.
Figure 11B:
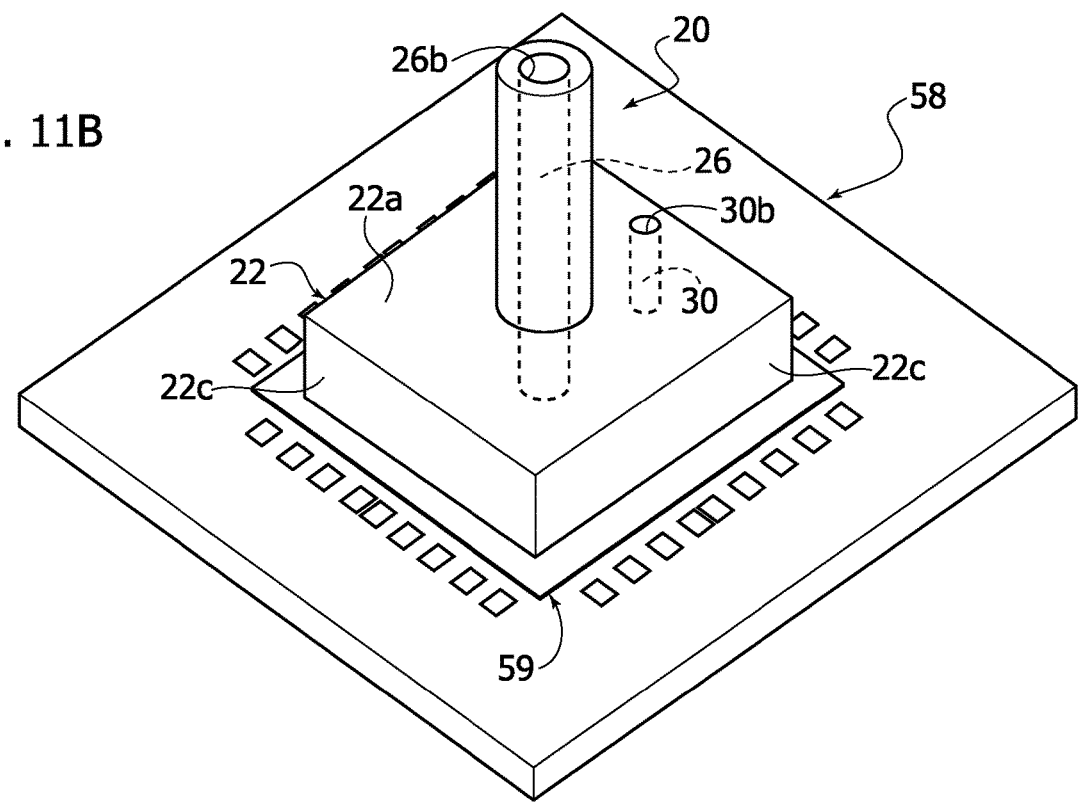

FIG. 8 (which is substantially similar to FIG. 1D) plus FIGS. 9A and 9B are exemplary of the possibility of applying embodiments also to QFN standard packages in addition to QFN-MR (multi row) packages, as exemplified in figures such as FIGS. 1C to 7B.

One or more embodiments may be used also in connection with LGA/BGA packages, as exemplified in FIGS. 10 to 13B.

LGA (land grid array)/BGA (ball grid array) is a package type involving an organic material substrate molding, referenced 58.

As illustrated (see for instance FIG. 10, which is again substantially similar to FIG. 1D and FIG. 8) a die pad 59, optionally comprising copper, may be arranged on a (upper or front) surface of the organic substrate 58. The thickness of the die pad 59 may be between 17.5 μm and 35 μm.

As exemplified herein (see FIG. 11A) an etched portion 38 may be formed on the die pad 59 and the device 20 may be arranged on the die pad 59 (see FIG. 11B) so that at least part of the sculptured formation 24 and at least part of the first end 30a of the secondary duct 30 extend over the etched portion 38 in the die pad 59. Glue 46 may then be dispensed in the so-formed confined chamber 40 through the secondary duct 30, in a way similar to that described above for QFN packages.

Figure 12:
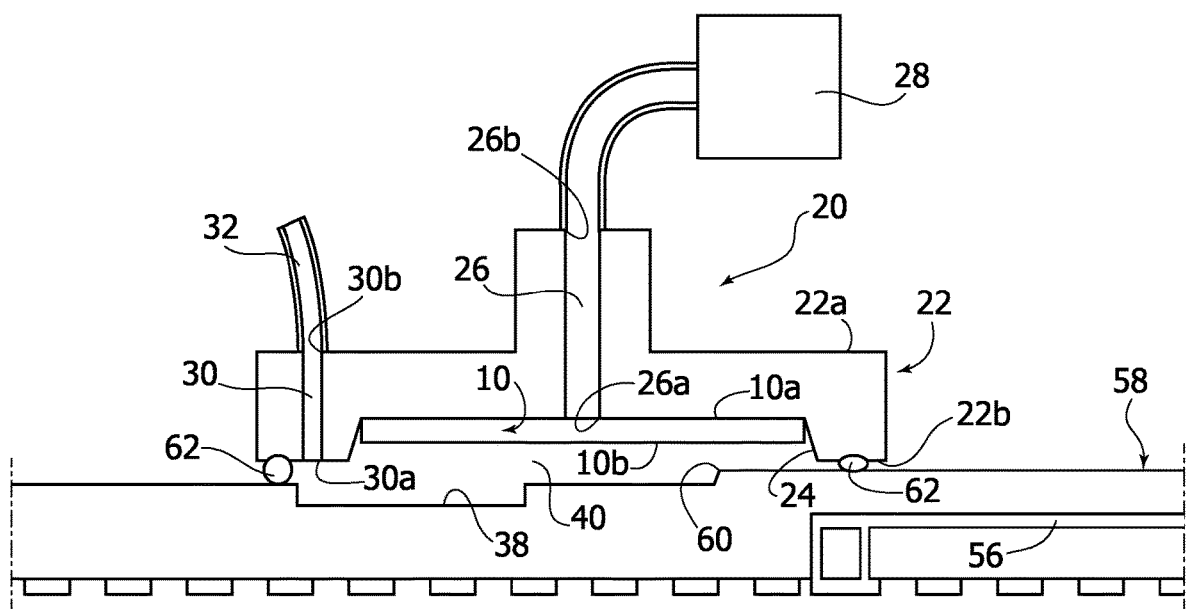
FIG. 12 is a side elevational view exemplary of possible steps in an embodiment of a method.

FIG. 12 (which is once more substantially similar to FIGS. 1D, 8 and 10) is exemplary of the possibility of providing one or more tracks 56, optionally comprising copper, embedded in the organic substrate 58.

The provision of the track(s) 56 may result in different levels of the substrate 58 at opposite sides of the area where the semiconductor chip or die 10 is intended to be arranged (see the step-wise formation referenced with 60 in FIG. 12, which may have a height corresponding to the thickness of the track(s) 56).

The difference in level may facilitate undesired leaking of the glue 46 dispensed through the secondary duct(s) 30 of the device 20, out of the confined chamber 40. As a result, the mutual adhesion between the semiconductor chip or die 10 and the organic substrate 58 may be negatively affected.

In one or more embodiments, such an undesired leaking of the glue 46 out of the confined chamber 40 may be countered by arranging one or more gaskets 62, optionally comprising PTFE, at the interface between the second face 22b of the prismatic portion 22 of the device 20 and the organic substrate 58. The gasket(s) 62 may facilitate reducing the difference in level formed at the portion of the organic substrate 58 where the semiconductor chip or die 10 is intended to be arranged.

As exemplified herein, the device 20 may be again arranged on the substrate 58 (see FIG. 13B) so that at least part of the sculptured formation 24 and at least part of the first end 30a of the secondary duct 30 extend over the etched portion 38 in the substrate 58. Glue 46 may then be dispensed in the so-formed confined chamber 40 through the secondary duct 30, in a way similar to that described above.

FIGS. 14A to 14H are exemplary of the possibility of implementing steps as exemplified previously (see for instance FIGS. 1A to 7B) by referring to a single chip or die 10 to a plurality of chips or dice 10 processed substantially simultaneously as otherwise conventional in the art of manufacturing semiconductor devices.

Figure 13A:
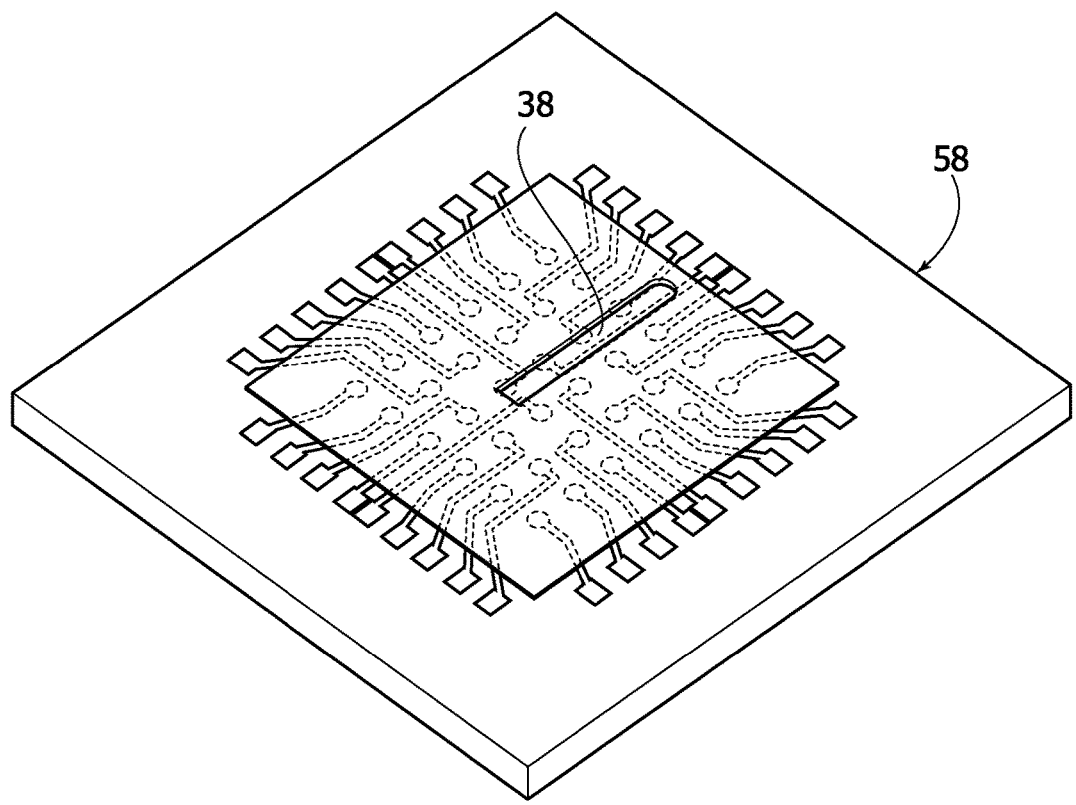
FIGS. 13A and 13B are perspective views of certain elements of a substrate in embodiments.
Figure 13B:
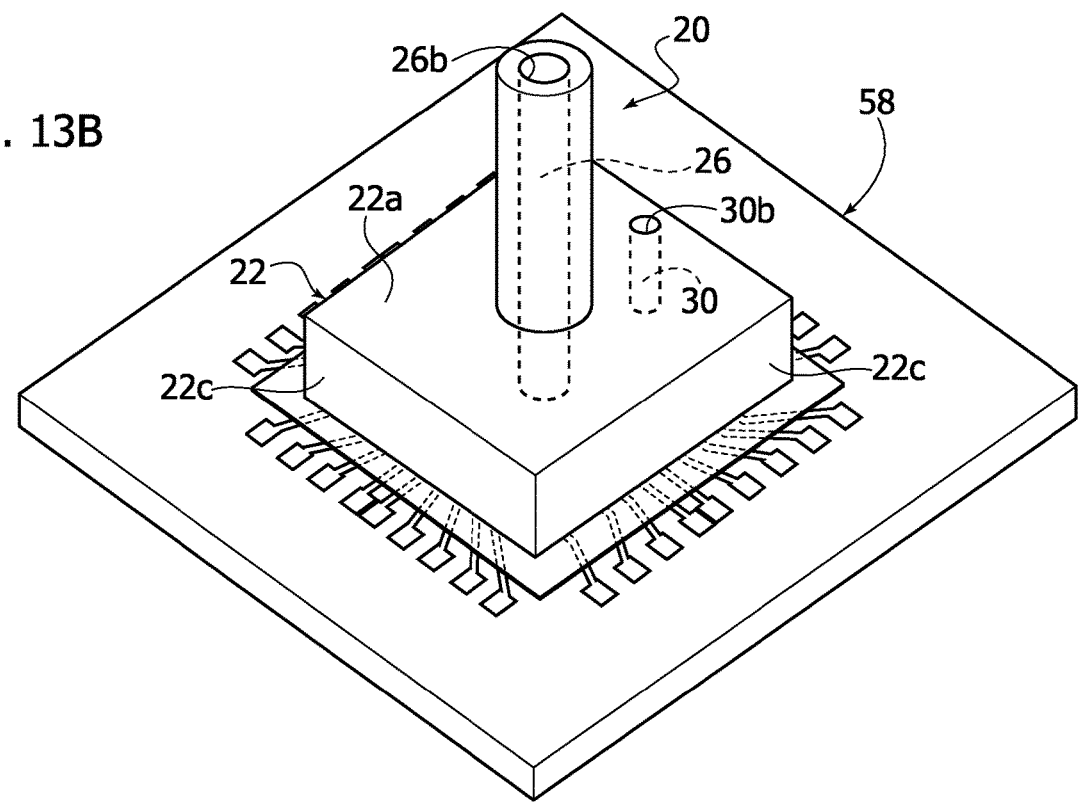

It will be otherwise understood that the disclosure provided in connection with FIGS. 14A to 14H may likewise apply to steps as exemplified by referring to a single chip or die 10 in connection with FIGS. 8 and 9A, 9B, FIGS. 10 and 11A, 11B plus FIGS. 12 and 13A, 13B.

As noted, throughout the figures annexed herein, like parts or elements are indicated with like references/numerals and a corresponding description will not be repeated for brevity, with the proviso that: in figures such as FIGS. 1C to 7B, the holding device 20 is illustrated located above the chips or dice 10 with the substrate 36 below the chips or dice 10 and the glue 46 dispensed into the chamber 40 from above the semiconductor chips or dice 10; and the arrangement of parts illustrated in FIGS. 14A-14F is at least partly turned "upside down", insofar the holding device 20 is located below the chips or dice 10 with the leadframe (substrate) 36 arranged above the chips or dice 10 and the glue 46 dispensed into the chamber 40 from a container 46 illustrated under the semiconductor chips or dice 10.

FIGS. 14A-14B are exemplary of arranging a plurality of semiconductor chips or dice 10 on a "manifold" holding device 20 (which may occur via one or more picking devices 16).

As exemplified herein (and according to a solution which may be resorted to also in embodiments as exemplified in the previous figures), the holding device 20 may comprise inserts 74, optionally comprising metallic material and PTFE, where the sculptured formations 24 are formed.

The main ducts 26 and the secondary ducts 30 extending through the plural holding device 20 may extend through the inserts 74 as well. The inserts 74 may be provided to facilitate (accurate) positioning of the semiconductor dice or chips 10.

FIGS. 14C and 14D are exemplary of the leadframe 36, having a plurality of etched portions 38 formed on its front surface (here facing downwards), being positioned onto (abutting against) the holding device 20, having the semiconductor dice or chips 10 arranged thereon.

Figure 14E:
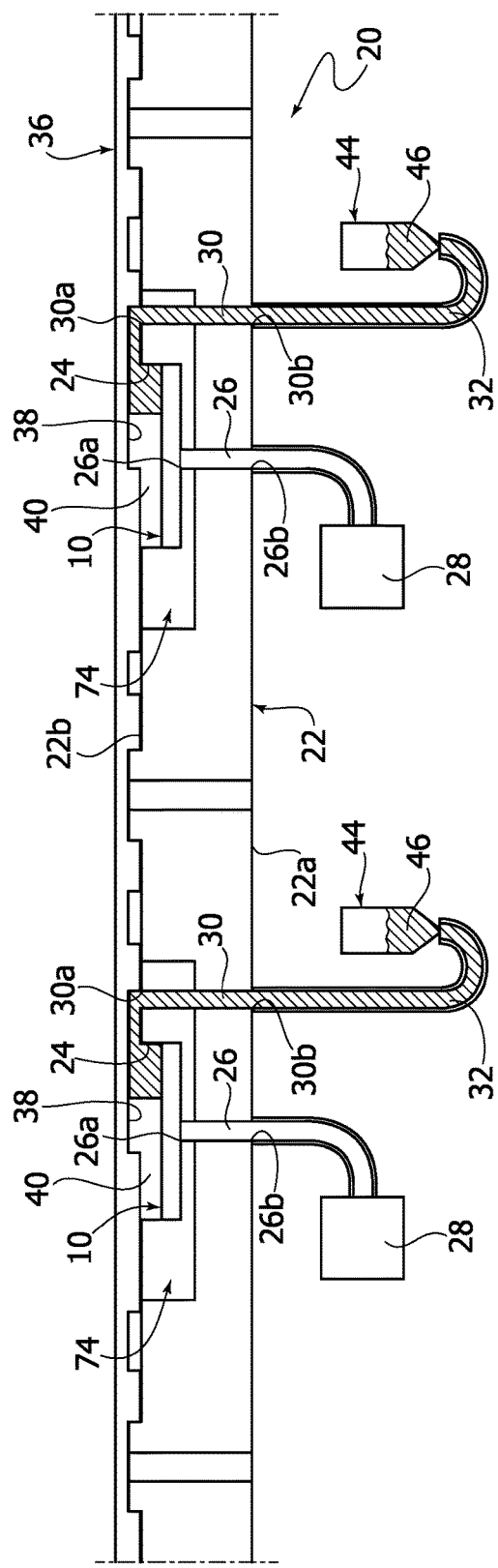
Figure 14F:
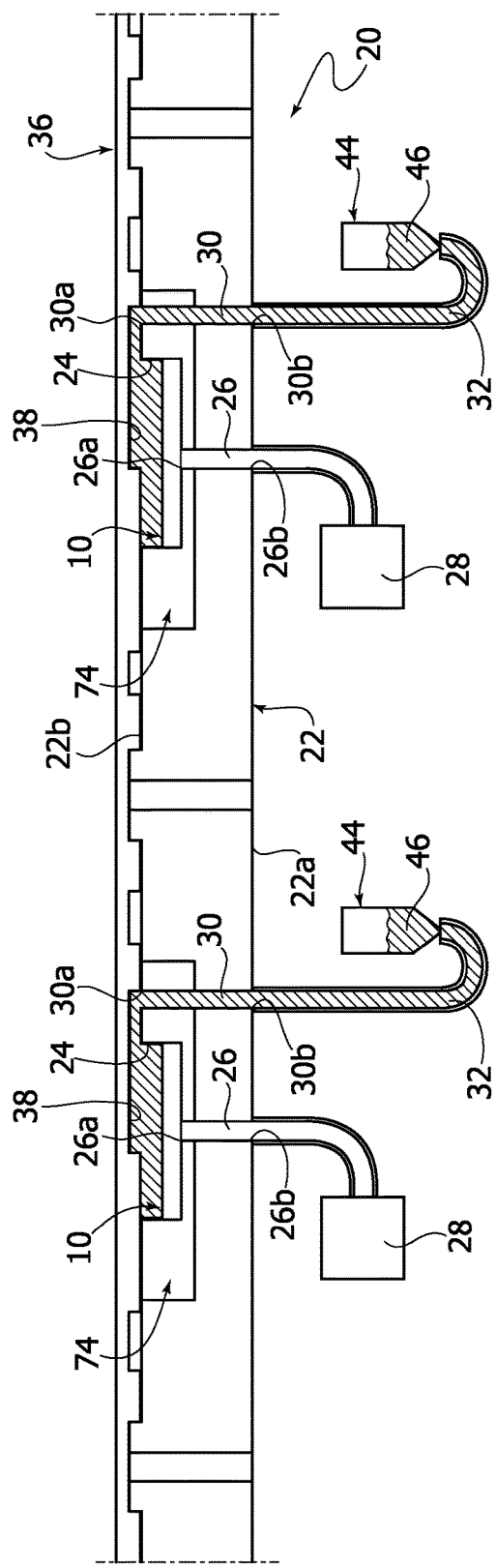

The sequence of FIGS. 14E-14F is exemplary of die attach glue 46 being dispensed from the container(s) 44 through the secondary ducts 30 into the confined chambers 40 resulting from the steps of FIGS. 14C-14D, in order to facilitate attaching the semiconductor chips or dice 10 on the leadframe 36.

Curing the glue 46 dispensed at the interfaces between the semiconductor chips or dice 10 and the leadframes 36 can again be cured by placing the resulting assembly in an oven (not visible in the figures).

As exemplified in FIG. 14G, two or more holding device 20 resulting from the step of FIG. 14F may be flipped, stacked on top of each other and arranged in an oven to facilitate curing the glue 46 dispensed at the interfaces between the semiconductor chips or dice 10 and the leadframes 36.

FIG. 14H is exemplary of the device resulting from the step of removing the holding device 20 from the leadframe 36 having the semiconductor chips or dice 10 attached thereon.

Further steps as conventional in the art (wire bonding to provide electrical connection between die pads at the front or top surface of the chip or die 10 and leads in the leadframe 36, molding insulating package compound, singulation) can finalize the production of individual semiconductor devices.

A method as exemplified herein may comprise:
arranging a chip holding device (for instance, 20) having at least one semiconductor chip or die (for instance, 10) arranged at a chip retaining formation (for instance, 24) provided in the chip holding device facing a chip attachment location (for instance, 38) in a chip mounting substrate (for instance, 36; 58), wherein a cavity (for instance, 40) is formed between the at least one semiconductor chip or die arranged at said chip retaining formation in the chip holding device and the chip attachment location in said chip mounting substrate; and dispensing (for instance, 30, 32) chip attachment material (for instance, 46) into said cavity wherein said at least one semiconductor chip or die is attached onto said chip mounting substrate at said chip attachment location.

A method as exemplified herein may comprise retaining said at least one semiconductor chip or die in said chip holding device via sub-atmospheric pressure (for instance, at 28) applied at said chip retaining formation.

In a method as exemplified herein, said chip retaining formation may comprise a recessed portion in said chip holding device.

A method as exemplified herein may comprise:

providing at least one etched portion at said chip attachment location in said chip mounting substrate; and dispensing chip attachment material into said cavity at said at least one etched portion at said chip attachment location.

A method as exemplified herein may comprise at least one of:

facilitating dispensing chip attachment material into said cavity by contacting said chip mounting substrate with a heating surface (for instance, 48), preferably at a temperature between 60° C. and 90° C.; and/or facilitating curing of chip attachment material dispensed into said cavity by heating, preferably oven heating, said substrate having said at least one semiconductor chip or die attached thereon, preferably at a temperature between 150° C. and 250° C.; and/or countering flow of chip attachment material between said at least one semiconductor chip or die and said chip retaining formation by heating said at least one semiconductor chip or die arranged at said chip retaining formation opposite said cavity with a heating source (for instance, 52), preferably at a temperature between 150° C. and 170° C.

A method as exemplified herein may comprise providing said chip retaining formation with surface sculpturing (for instance, 31) providing an air venting pathway from said cavity during dispensing chip attachment material into said cavity.

A chip holding device for use in a method as exemplified herein may comprise:

a device body (for instance, 22) having mutually opposed surfaces (for instance 22a, 22b) with said chip retaining formation provided at one (for instance, 22b) of said mutually opposed surfaces; and at least one attachment material dispensing duct (for instance, 30) extending through said device body, said at least one attachment material dispensing duct having a material dispensing end (for instance, 30a) opening at said one of said mutually opposed surfaces adjacent said chip retaining formation, said at least one attachment material dispensing duct configured to dispense chip attachment material into said cavity.

A chip holding device for use in a method as exemplified herein may comprise at least one device holding duct (for instance, 26) extending through said device body, said at least one device holding duct having a material dispensing end (for instance, 26a) opening at said chip retaining formation provided at said one of said mutually opposed surfaces to convey sub-atmospheric pressure thereto.

In a chip holding device for use in a method as exemplified herein, said chip retaining formation may comprise a recessed portion in said chip holding device.

In a chip holding device for use in a method as exemplified herein, said device body may comprise at least one heating source located adjacent said chip retaining formation, said at least one heating source preferably activatable at a temperature between 150° C. and 170° C.

In a chip holding device for use in a method as exemplified herein, said one of said mutually opposed surfaces comprises surface sculpturing configured to provide an air venting pathway from said cavity during dispensing chip attachment material into said cavity.

Without prejudice to the underlying principles, the details and the embodiments may vary, even significantly, with respect to what has been described by way of example only without departing from the scope of the embodiments.

The claims are an integral part of the technical disclosure provided herein in connection with the embodiments.

The extent of protection is determined by the annexed claims.

The invention claimed is:

1. A method for mounting at least one semiconductor chip or die to a chip mounting substrate, comprising:
   holding the at least one semiconductor chip or die within a chip retaining formation provided by a chip holding device that includes a periphery having a lower face that surrounds the chip retaining formation;
   arranging said chip holding device to face a chip attachment location of the chip mounting substrate, wherein arranging places the lower face at the periphery of the chip holding device in contact with the chip mounting substrate and forms a cavity between the at least one semiconductor chip or die and the chip attachment location; and
   dispensing a chip attachment material into said cavity through a duct passing through the chip holding device and having an end opening on the lower face of the chip holding device, wherein said chip attachment material attaches the at least one semiconductor chip or die onto said chip mounting substrate at said chip attachment location.

2. The method of claim 1, wherein holding comprises retaining said at least one semiconductor chip or die within the chip retaining formation of said chip holding device via application of a sub-atmospheric pressure.

3. The method of claim 1, wherein said chip retaining formation comprises a recessed portion in said chip holding device that is peripherally surrounded by said lower face.

4. The method of claim 1, further comprising:
   providing at least one etched portion at said chip attachment location in said chip mounting substrate; and
   wherein dispensing comprises aligning the end opening of the duct on the lower face with the at least one etched portion and dispensing the chip attachment material from the end opening through said at least one etched portion and into the cavity.

5. The method of claim 1, further comprising contacting said chip mounting substrate with a heating surface in order to facilitate dispensing chip attachment material into said cavity.

6. The method of claim 5, further comprising heating said heating surface to a temperature between 60° C. and 90° C.

7. The method of claim 1, further comprising heating said chip mounting substrate in order to facilitate curing of the chip attachment material.

8. The method of claim 7, wherein heating comprises heating to a temperature between 150° C. and 250° C.

9. The method of claim 1, further comprising heating said at least one semiconductor chip or die at a location opposite said cavity with a heating source in order to counter flow of chip attachment material between said at least one semiconductor chip or die and said chip retaining formation.

10. The method of claim 9, further comprising heating said heating source to a temperature between 150° C. and 170° C.

11. The method of claim 1, further comprising providing at the lower face of said chip retaining formation surface sculpturing to provide an air venting pathway from said cavity during dispensing chip attachment material into said cavity.

12. The method of claim 1, wherein arranging said chip holding device comprises compressing a gasket between the periphery of the chip holding device and the chip mounting substrate.

13. A method for mounting at least one semiconductor chip or die to a chip mounting substrate, comprising:
provid ing a chip holding device that includes an upper face, a lower face and a chip retaining formation that is recessed into the lower face, said lower face peripherally surrounding the chip retaining formation;
holding the at least one semiconductor chip or die within the chip retaining formation;
arranging said chip holding device to face a chip attachment location of the chip mounting substrate, wherein arranging places the lower face at the of the chip holding device in contact with the chip mounting substrate and forms a cavity between the recessed chip retaining formation holding the at least one semiconductor chip or die and the chip attachment location; and
dispensing a chip attachment material into said cavity through a duct passing through the chip holding device and having an end opening on the lower face of the chip holding device, wherein said chip attachment material attaches the at least one semiconductor chip or die onto said chip mounting substrate at said chip attachment location.

14. The method of claim 13, further comprising:
providing at least one etched portion at said chip attachment location in said chip mounting substrate; and
wherein dispensing comprises aligning the end opening of the duct on the lower face with the at least one etched portion and dispensing the chip attachment material from the end opening through said at least one etched portion and into the cavity.

15. The method of claim 1, further comprising providing at the lower face of said chip retaining formation surface sculpturing to provide an air venting pathway from said cavity during dispensing chip attachment material into said cavity.

* * * * *